(12) United States Patent
Huang

(10) Patent No.: US 11,728,260 B2
(45) Date of Patent: Aug. 15, 2023

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 144 days.

(21) Appl. No.: 17/125,842

(22) Filed: Dec. 17, 2020

(65) Prior Publication Data

US 2022/0199509 A1  Jun. 23, 2022

(51) Int. Cl.
*H01L 23/498* (2006.01)
*H01L 21/48* (2006.01)
*H01L 23/00* (2006.01)

(52) U.S. Cl.
CPC .... *H01L 23/49838* (2013.01); *H01L 21/4857* (2013.01); *H01L 23/49822* (2013.01); *H01L 23/562* (2013.01); *H01L 24/16* (2013.01); *H01L 2224/16227* (2013.01); *H01L 2924/3511* (2013.01); *H01L 2924/37001* (2013.01)

(58) Field of Classification Search
CPC ........... H01L 23/49838; H01L 21/4857; H01L 23/49822; H01L 23/562; H01L 24/16; H01L 2224/16227; H01L 2924/3511; H01L 2924/37001
See application file for complete search history.

(56) References Cited

U.S. PATENT DOCUMENTS

| | | | |
|---|---|---|---|
| 8,884,440 B2 * | 11/2014 | Kim | H01L 21/76898 257/621 |
| 2009/0290316 A1 * | 11/2009 | Kariya | H01L 23/50 361/767 |
| 2018/0061765 A1 * | 3/2018 | Gozu | H01L 21/4857 |

* cited by examiner

*Primary Examiner* — Benjamin Tzu-Hung Liu
(74) *Attorney, Agent, or Firm* — Foley & Lardner LLP

(57) ABSTRACT

A wiring structure and a method for manufacturing the same are provided. The wiring structure includes a lower conductive structure, an upper conductive structure and a conductive via. The lower conductive structure includes a first dielectric layer and a first circuit layer in contact with the first dielectric layer. The upper conductive structure is attached to the lower conductive structure. The upper conductive structure includes a plurality of second dielectric layers, a plurality of second circuit layers in contact with the second dielectric layers, and defines an accommodating hole. An insulation material is disposed in the accommodating hole. The conductive via extends through the insulation material, and electrically connects the lower conductive structure.

17 Claims, 42 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least one conductive via, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a wiring structure includes a lower conductive structure, an upper conductive structure and a conductive via. The lower conductive structure includes a first dielectric layer and a first circuit layer in contact with the first dielectric layer. The upper conductive structure is attached to the lower conductive structure. The upper conductive structure includes a plurality of second dielectric layers, a plurality of second circuit layers in contact with the second dielectric layers, and defines an accommodating hole. An insulation material is disposed in the accommodating hole. The conductive via extends through the insulation material, and electrically connects the lower conductive structure.

In some embodiments, a method for manufacturing a wiring structure includes: (a) forming an accommodating hole in an upper conductive structure; (b) forming an insulation material in the accommodating hole; (c) attaching the upper conductive structure to a lower conductive structure; and (d) forming a conductive via extending through the insulation material.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
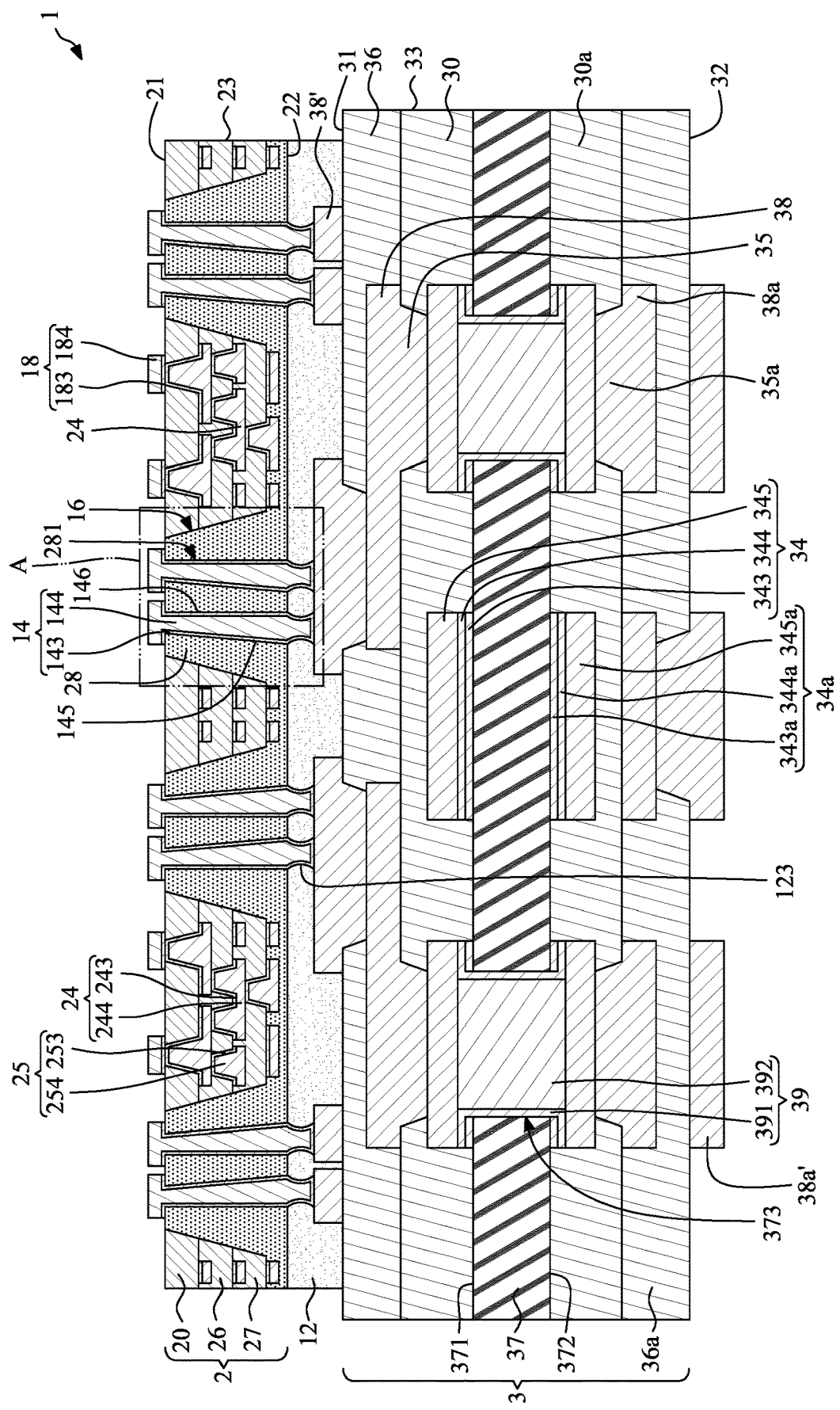
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
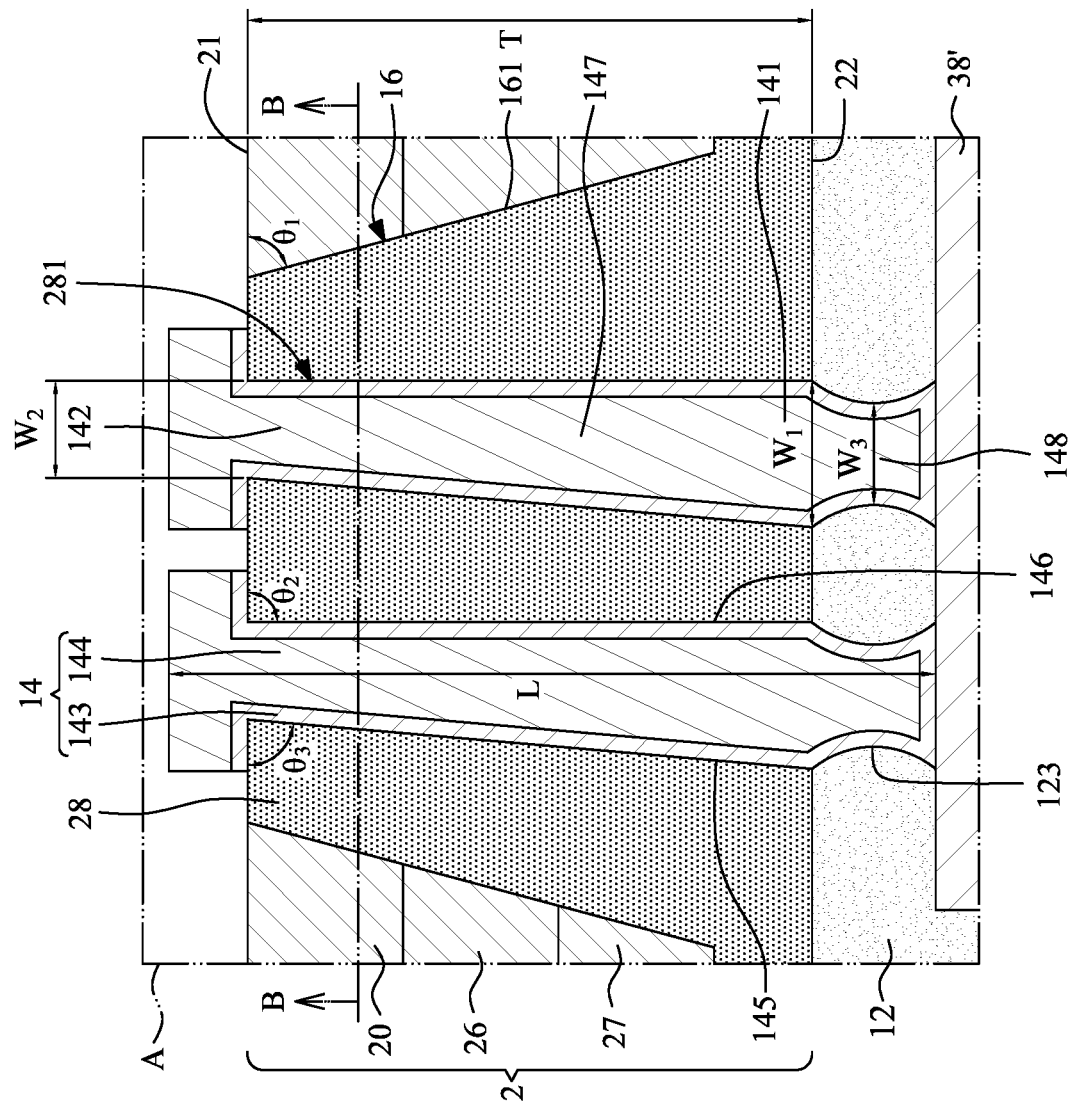
FIG. 2 illustrates a partially enlarged view of a region "A" in FIG. 1.
Figure 3:
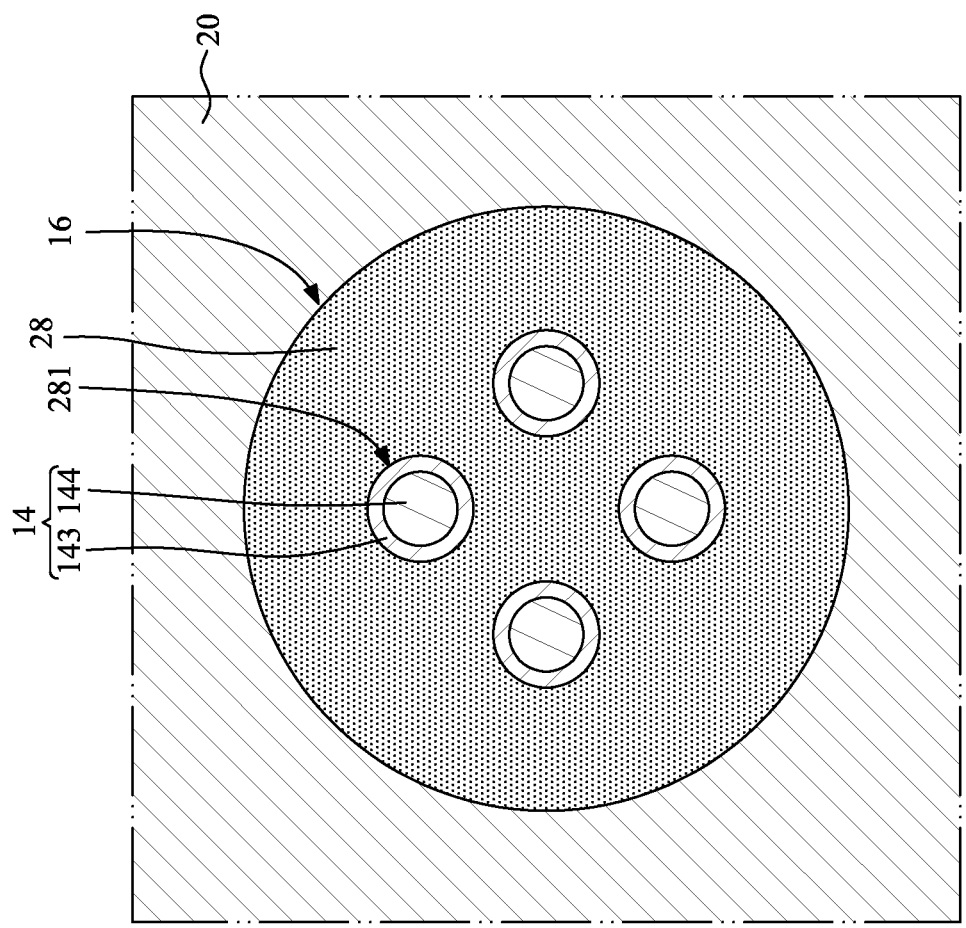
FIG. 3 illustrates a cross-sectional view taken along line B-B' of FIG. 2.

FIG. 1 illustrates a cross-sectional view of a wiring structure 1 according to some embodiments of the present disclosure. FIG. 2 illustrates a partially enlarged view of a region "A" in FIG. 1. FIG. 3 illustrates a cross-sectional view taken along line B-B' of FIG. 2. The wiring structure 1 may include an upper conductive structure (e.g., a conductive structure) 2, at least one conductive via 14 and an outer circuit layer 18. In some embodiments, the wiring structure 1 may further include an intermediate layer 12 and a lower conductive structure 3.

The upper conductive structure 2 is disposed on the lower conductive structure 3, and includes a plurality of second dielectric layers 20, 26, 27, a plurality of second circuit layers 24 (formed of a metal, a metal alloy, or other conductive material) in contact with the second dielectric layers 20, 26, 27, an insulation material 28 and a plurality of inner conductive vias 25. In some embodiments, the upper conductive structure 2 may be similar to a coreless substrate, and may be a bumping level redistribution structure. The upper conductive structure 2 may be also referred to as "a high-density conductive structure" or "a high-density stacked structure". The circuit layers 24 of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21, a bottom surface 22 opposite to the top surface 21, and a lateral surface 23 extending between the top surface 21 and the bottom surface 22. As shown in FIG. 1, the second dielectric layers 20, 26, 27 are stacked on one another. For example, the second dielectric layer 20 may be the topmost dielectric layer. In some embodiments, a material of the second dielectric layers 20, 26, 27 is transparent, and can be seen through or detected by human eyes or machine. In some embodiments, a transparent material of the second dielectric layers 20, 26, 27 has a light transmission for a wavelength in the visible range (or other pertinent wavelength for detection of a mark) of at least about 60%, at least about 70%, or at least about 80%. In some embodiments, a material of the second dielectric layers 20, 26, 27 may be made of a cured photoimageable dielectric (PID) material such as epoxy or polyimide (PI) including photoinitiators.

The second circuit layers 24 may be fan-out circuit layers or redistribution layers (RDLs), and an L/S of the second circuit layer 24 may be less than about 10 µm/10 µm, less than or equal to 8 µm/8 µm, less than or equal to 5 µm/5 µm, less than or equal to 3 µm/3 µm, less than or equal to about 2 µm/about 2 µm, or less than or equal to about 1.8 µm/about 1.8 µm. In some embodiments, the second circuit layer 24 is embedded in or is disposed on the corresponding second dielectric layers 20, 26, 27. In some embodiments, each second circuit layer 24 may include a seed layer 243 and a conductive material 244 (e.g., a plating metallic material) disposed on the seed layer 243. As shown in FIG. 1, the bottommost second circuit layer 24 is disposed on and protrudes from the bottommost second dielectric layer (e.g., the second dielectric layer 27) of the upper conductive structure 2. As illustrated in the embodiment of FIG. 1, a horizontally connecting or extending circuit layer is omitted in the topmost second dielectric layer 20.

Some of the inner conductive vias 25 are disposed between two adjacent second circuit layers 24 for electrically connecting the two second circuit layers 24. Some of the inner conductive vias 25 are exposed from the top surface 21 of the upper conductive structure 2 (e.g., the top surface 21 of the second dielectric layer 20). In some embodiments, each inner conductive via 25 may include a seed layer 253 and a conductive material 254 (e.g., a plating metallic material) disposed on the seed layer 253. Each inner conductive via 25 tapers upwardly along a direction from the bottom surface 22 towards the top surface 21 of the upper conductive structure 2.

As shown in FIG. 1 and FIG. 2, the second dielectric layers 20, 26, 27 of the upper conductive structure 2 together define at least one accommodating hole 16 extending through the second dielectric layers 20, 26, 27. The accommodating hole 16 may taper upwardly along a direction from the bottom surface 22 towards the top surface 21 of the upper conductive structure 2. An angle $\theta_1$ between the sidewall 161 of the accommodating hole 16 and the top surface 21 of the upper conductive structure 2 may be in a range from 70 degrees to 90 degrees, 70 degrees to 80 degrees, or 75 degrees to 80 degrees.

The insulation material 28 may be disposed in and fill the accommodating hole 16. Thus, the insulation material 28 may extend through the second dielectric layers 20, 26, 27. A material of the insulation material 28 may be made of a cured photoimageable dielectric (PID) material such as epoxy or polyimide (PI) including photoinitiators. For example, the material of the insulation material 28 may be same as or different from the material of the second dielectric layers 20, 26, 27. As shown in FIG. 1, the insulation material 28 may cover and contact an outermost dielectric layer such as the bottommost dielectric layer (e.g., the second dielectric layer 27) of the second dielectric layers 20, 26, 27. Further, the insulation material 28 may cover and contact an outermost second circuit layer such as a bottommost second circuit layer of the circuit layers 24. The insulation material 28 may define at least one through hole 281 extending through the insulation material 28 within the accommodating hole 16. In some embodiments, the insulation material 28 may define a plurality of through holes 281 disposed in one accommodating hole 16. The insulation material 28 may be a monolithic or one-piece structure, and there may be no horizontally connecting or extending circuit layer in the insulation material 28. The boundary between the insulation material 28 and the second dielectric layers 20, 26, 27 (i.e., the sidewall of the accommodating hole 16) may be substantially perpendicular to the bottom surface 22 or the top surface 21 of the upper conductive structure 2.

The at least one conductive via 14 is disposed in and fills the at least one through hole 281. Thus, the conductive via 14 may extend through the insulation material 28 and the upper conductive structure 2. In some embodiments, the at least one conductive via 14 may include a plurality of conductive vias 14 disposed within one accommodating hole 16. The conductive via 14 may be a monolithic or one-piece structure. A peripheral side surface 145 or 146 of the conductive via 14 may be a continuous or smooth surface. That is, in a cross-sectional view, the peripheral side surface 145 or 146 of the conductive via 14 may be a substantially straight line. In some embodiments, the conductive via 14 may include a seed layer 143 and a conductive material 144 (e.g., a plating metallic material such as copper). The seed layer 143 is interposed between the conductive material 144 of the conductive via 14 and the sidewall of the through hole 281. In some embodiments, the conductive material 144 of the conductive via 14 may be different from the conductive material 244 of the second circuit layer 24. For example, the conductive material 144 of the conductive via 14 may include copper-iron composite, and the conductive material 244 of the second circuit layer 24 may include copper sulfate. In addition, a lattice of the conductive material 144 of the conductive via 14 may be different form a lattice of the conductive material 244 of the second circuit layer 24. A grain size of the conductive material 144 of the conductive via 14 may be greater than a grain size of the conductive material 244 of the second circuit layer 24. In some embodiments, the conductive via 14 may be used for powering or grounding, and the second circuit layers 24 may be not electrically connected to or contact the conductive via 14. Alternatively, some of the conductive vias 14 may be used for transmitting signals.

The outer circuit layer 18 is disposed on the top surface 21 of the upper conductive structure 2, and may be formed concurrently with the conductive via 14. In some embodiments, the outer circuit layer 18 may include a seed layer 183 and a conductive material 184 (e.g., a plating metallic material such as copper). The seed layer 183 is interposed between the conductive material 184 and the top surface 21 of the upper conductive structure 2. The seed layer 183 of the outer circuit layer 18 and the seed layer 143 of the conductive via 14 may be the same layer. The conductive material 184 of the outer circuit layer 18 and the conductive material 144 of the conductive via 14 may be the same layer.

The lower conductive structure 3 includes at least one first dielectric layer (including, for example, one first upper dielectric layer 30, one first upper dielectric layer 36, one first lower dielectric layer 30a and one first lower dielectric layer 36a) and at least one first circuit layer (including, for example, three first upper circuit layers 34, 38, 38', three first lower circuit layers 34a, 38a, 38a' formed of a metal, a metal alloy, or other conductive material) in contact with the first dielectric layer (e.g., the first upper dielectric layers 30, 36, and the first lower dielectric layers 30a, 36a). In some embodiments, the lower conductive structure 3 may be similar to a core substrate that further includes a core portion 37. The lower conductive structure 3 may be also referred to as "a lower stacked structure" or "a low-density conductive structure" or "a low-density stacked structure". The first circuit layers (including, for example, the first upper circuit layers 34, 38, 38' and the first lower circuit layers 34a, 38a, 38a') of the lower conductive structure 3 may be also referred to as "a low-density circuit layer". As shown in FIG. 1, the lower conductive structure 3 has a top surface 31, a bottom surface 32 opposite to the top surface 31, and a lateral surface 33 extending between the top surface 31 and the bottom surface 32. The lower conductive structure 3 may include a plurality of first dielectric layers (for example, the first upper dielectric layers 30, 36 and the first lower dielectric layers 30a, 36a), a plurality of first circuit layers (for example, the first upper circuit layers 34, 38, 38' and the first lower circuit layers 34a, 38a, 38a') and at least one inner conductive via (including, for example, a plurality of upper interconnection vias 35 and a plurality of lower interconnection vias 35a). As shown in FIG. 1, the lateral surface 23 of the upper conductive structure 2 may be displaced or recessed from the lateral surface 33 of the lower conductive structure 3.

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, the interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit the insulation material 392, and may include a bulk metallic material that fills the through hole 373.

The first upper dielectric layer 30 is disposed on the top surface 371 of the core portion 37. The first upper dielectric layer 36 is stacked or disposed on the first upper dielectric layer 30. In addition, the first lower dielectric layer 30a is disposed on the bottom surface 372 of the core portion 37. The first lower dielectric layer 36a is stacked or disposed on the first lower dielectric layer 30a.

A thickness of each of the second dielectric layers 20, 26, 27 of the upper conductive structure 2 is less than or equal to about 40%, less than or equal to about 35%, or less than or equal to about 30% of a thickness of each of the first dielectric layers 30, 36, 30a, 36a of the lower conductive structure 3. For example, a thickness of each of the second dielectric layers 20, 26, 27 of the upper conductive structure 2 may be less than or equal to about 7 µm, and a thickness of each of the first dielectric layers 30, 36, 30a, 36a of the lower conductive structure 3 may be about 40 µm. In addition, a material of the first dielectric layers 30, 36, 30a, 36a of the lower conductive structure 3 may be different from the material of the second dielectric layers 20, 26, 27 of the upper conductive structure 2. For example, the material of the first dielectric layers 30, 36, 30a, 36a of the lower conductive structure 3 may be polypropylene (PP) or ajinomoto build-up film (ABF).

An L/S of the first upper circuit layer 34 may be greater than or equal to about 10 µm/about 10 µm. Thus, the L/S of the first upper circuit layer 34 may be greater than or equal to about three, four, or five times the L/S of the second circuit layer 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the first upper circuit layer 38 may be greater than or equal to about 10 µm/about 10 µm. Thus, the L/S of the first upper circuit layer 38 may be substantially equal to the L/S of the first upper circuit layer 34, and may be greater than or equal to about three, four, or five times the L/S of the second circuit layer 24 of the upper conductive structure 2. In some embodiments, the first upper circuit layer 38 is formed or disposed on the first upper dielectric layer 30, and covered by the first upper dielectric layer 36. In some embodiments, the first upper circuit layer 38 is electrically connected to the first upper circuit layer 34 through the upper interconnection vias 35. That is, the upper interconnection vias 35 are disposed between the first upper circuit layers 34, 38 for electrically connecting the first upper circuit layers 34, 38. In some embodiments, the first upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the first upper circuit layer 38' is disposed on and protrudes from the top surface of the first upper dielectric layer 36. In some embodiments, the first upper circuit layer 38 is electrically connected to the first upper circuit layer 38' through the upper interconnection vias 35. In some embodiments, the first upper circuit layer 38' is the topmost circuit layer of the lower conductive structure 3.

An L/S of the first lower circuit layer 34a may be greater than or equal to about 10 µm/about 10 Thus, the L/S of the first lower circuit layer 34a may be greater than or equal to about three, four, or five times the L/S of the second circuit layer 24 of the upper conductive structure 2. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the first lower circuit layer 38a may be greater than or equal to about 10 µm/about 10 Thus, the L/S of the first lower circuit layer 38a may be substantially equal to the L/S of the first upper circuit layer 34, and may be greater than or equal to about three, four, or five times the L/S of the second circuit layer 24 of the upper conductive structure 2. In some embodiments, the first lower circuit layer 38a is formed or disposed on the first lower dielectric layer 30a, and covered by the first lower dielectric layer 36a. In some embodiments, the first lower circuit layer 38a is electrically connected to the first lower circuit layer 34a through the lower interconnection vias 35a. That is, the lower interconnection vias 35a are disposed between the second lower circuit layers 34a, 38a for electrically connecting the second lower circuit layers 34a, 38a. In some embodiments, the first lower circuit layer 38a and the lower interconnection vias 35a are formed integrally as a monolithic or one-piece structure. The lower interconnection via 35a tapers upwardly along a direction from the bottom surface 32 towards the top surface 31 of the lower conductive structure 3.

In addition, in some embodiments, the first lower circuit layer 38a' is disposed on and protrudes from the bottom surface of the first lower dielectric layer 36a. In some embodiments, the first lower circuit layer 38a' is electrically connected to the first lower circuit layer 38a through the lower interconnection vias 35a. That is, the lower interconnection vias 35a are disposed between the first lower circuit layers 38a, 38a' for electrically connecting the first lower circuit layers 38a, 38a'. In some embodiments, the first lower circuit layer 38a' is the bottommost low-density circuit layer of the lower conductive structure 3.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. The upper conductive structure 2 is attached to the lower conductive structure 3 through the intermediate layer 12. In some embodiments, the intermediate layer 12 may be an adhesion layer that is cured from an adhesive material (e.g., includes a cured adhesive material such as an adhesive polymeric material). Thus, the insulation material 28 of the upper conductive structure 2 contacts the intermediate layer 12, and the topmost circuit layer (e.g., the second upper circuit layer 38') of the lower conductive structure 3 is embedded in the intermediate layer 12.

In some embodiments, a material of the intermediate layer 12 is transparent, and can be seen through by human eyes or machine. In addition, the material of the intermediate layer 12 may be different from the material of the first dielectric layers 30, 36, 30a, 36a of the lower conductive structure 3 and the material of the second dielectric layers 20, 26, 27 of the upper conductive structure 2. For example, the material of the intermediate layer 12 may be ABF, or ABF-like dielectric film.

The intermediate layer 12 defines at least one through hole 123. In some embodiments, the through hole 123 of the intermediate layer 12 extends through the intermediate layer 12 and terminates at or on a topmost circuit layer (e.g., the first upper circuit layer 38') of the lower conductive structure 3. The through hole 123 of the intermediate layer 12 may expose a portion of the topmost circuit layer (e.g., a top surface of the first upper circuit layer 38') of the lower conductive structure 3. In some embodiments, the sidewall of the through hole 123 of the intermediate layer 12 may be curved since it may be formed by plasma. For example, the sidewall of the through hole 123 of the intermediate layer 12 may define a neck portion.

As shown in FIG. 1, the through hole 123 of the intermediate layer 12 may be aligned with and in communication with the through hole 281 of the insulation material 28 of the upper conductive structure 2 for accommodating the conductive via 14. Thus, a lower portion 148 of the conductive via 14 may be disposed in the through hole 123 of the intermediate layer 12. The conductive via 14 may further extend through the through hole 123 of the intermediate layer 12, and is electrically connected to the topmost circuit layer (e.g., the top surface of the second upper circuit layer 38') of the lower conductive structure 3.

Referring to FIG. 2, the conductive via 14 extends from the top surface 21 of the upper conductive structure 2 to the bottom surface of the intermediate layer 12 to terminate at or on a portion of the topmost circuit layer (e.g., the top surface of the first upper circuit layer 38') of the lower conductive structure 3. Thus, a length L of the conductive via 14 is greater than a thickness T of the upper conductive structure 2. In some embodiments, the upper conductive structure 2 is electrically connected to the lower conductive structure 3 only through the conductive via 14. In addition, the conductive via 14 may include an upper portion 147 in the through hole 281 of the insulation material 28 and a lower portion 148 the through hole 123 of the intermediate layer 12. The upper portion 147 may include a first end 141 and a second end 142 opposite to the first end 141. The first end 141 is disposed adjacent to the bottom surface 22 of the upper conductive structure 2, and has a width $W_1$. The second end 142 is disposed adjacent to the top surface 21 of the upper conductive structure 2, and has a width $W_2$. The width $W_1$ of the first end 141 may be substantially equal to or greater than the width $W_2$ of the second end 142. For example, a ratio of the width $W_1$ of the first end 141 to the width $W_2$ of the second end 142 may be in a range from 0.7 to 1. A width of the conductive via 14 (e.g., the width $W_1$ of the first end 141 or the width $W_2$ of the second end 142) may be less than or equal to 60 μm, less than or equal to 40 μm, or less than or equal to 20 μm. Further, a ratio of the length L of the conductive via 14 to the width of the conductive via 14 (e.g., the width $W_1$ of the first end 141 or the width $W_2$ of the second end 142) is greater than one. For example, such ratio may be greater than three. That is, the length L of the conductive via 14 may be greater than three, four or five times the width of the conductive via 14 (e.g., the width $W_1$ of the first end 141 or the width $W_2$ of the second end 142). In addition, the lower portion 148 of the conductive via 14 may have a width $W_3$ that is less than the width $W_1$ of the first end 141.

A peripheral side surface 145 or 146 of the upper portion 147 of the conductive via 14 and a peripheral side surface of the lower portion 148 of the conductive via 14 are discontinuous. The upper portion 147 of the conductive via 14 in the insulation material 28 may taper upwardly. The lower portion 148 of the conductive via 14 may include a neck portion. A peripheral side surface of the lower portion 148 of the conductive via 14 is curved. The peripheral side surface of the lower portion 148 of the conductive via 14 may be concave from the intermediate layer 12.

In addition, an angle between the peripheral side surface 145 or 146 of the conductive via 14 and the top surface 21 of the upper conductive structure 2 (e.g., a top surface of the insulation material 28) is substantially equal to 90 degrees. For example, such angle may be in a range from 80 degrees to 100 degrees, or from 85 degrees to 95 degrees, and may be greater than the angle $\theta_1$ between the sidewall 161 of the accommodating hole 16 and the top surface 21 of the upper conductive structure 2 (e.g., the top surface of the insulation material 28). As shown in FIG. 2, a first portion 146 of the peripheral side surface of the upper portion 147 of the conductive via 14 is substantially perpendicular to the top surface 21 of the upper conductive structure 2, and a second portion 145 of the peripheral side surface of the upper portion 147 of the conductive via 14 is not perpendicular to the top surface 21 of the upper conductive structure 2. The first portion 146 is opposite to the second portion 145. For example, an angle $\theta_2$ between the first portion 146 of the peripheral side surface of the upper portion 147 of the conductive via 14 and the top surface 21 of the upper conductive structure 2 (e.g., the top surface of the insulation material 28) may be in a range from 90 degrees to 100 degrees, such as substantially equal to 90 degrees. An angle $\theta_3$ between the second portion 145 of the peripheral side surface of the upper portion 147 of the conductive via 14 and the top surface 21 of the upper conductive structure 2 (e.g., the top surface of the insulation material 28) may be in a range from 80 degrees to 90 degrees, such as substantially equal to 85 degrees.

In some embodiments, the bottom surface 22 of the upper conductive structure 2 may be ground during the manufacturing process, thus, a surface roughness of the bottom surface 22 of the upper conductive structure 2 may be greater than a surface roughness of the peripheral side surface 145 or 146 of the conductive via 14. For example, the surface roughness of the bottom surface 22 of the upper conductive structure 2 is greater than two or three times the surface roughness of the peripheral side surface 145 or 146 of the conductive via 14.

Referring to FIG. 3, there may be a plurality of conductive vias 14 (e.g., four conductive vias 14) disposed within one accommodating hole 16. However, the number of the conductive via(s) 14 in the accommodating hole 16 is not limited. For example, there may be one, two, three, five, or more than five conductive vias 14 disposed within one accommodating hole 16. A pitch between the conductive vias 14 in the accommodating hole 16 may be less than about 150 μm, less than about 100 μm, less than about 50 μm or less than about 30 μm.

As shown in the embodiment illustrated in FIG. 1, FIG. 2 and FIG. 3, the wiring structure 1 is a combination of the upper conductive structure 2 and the lower conductive structure 3, in which the second circuit layers 24 of the upper conductive structure 2 has fine pitch, high yield and low thickness; and the first circuit layers 34, 38, 38', 34a, 38a, 38a' of the lower conductive structure 3 have low manufacturing cost. Thus, the wiring structure 1 has an advantageous compromise of yield and manufacturing cost, and the wiring structure 1 has a relatively low thickness. The manufacturing yield for one layer of the second circuit layers 24 of the upper conductive structure 2 may be 99%, and the manufacturing yield for one layer of the first circuit layers 34, 38, 38', 34a, 38a, 38a' of the lower conductive structure 3 may be 90%. Thus, the yield of the wiring structure 1 may be improved. In addition, the warpage of the upper conductive structure 2 and the warpage of the lower conductive structure 3 are separated and will not influence each other. Thus, the warpage of the lower conductive structure 3 will not be accumulated onto the warpage of the upper conductive structure 2. Thus, the yield of the wiring structure 1 may be further improved.

Figure 19:
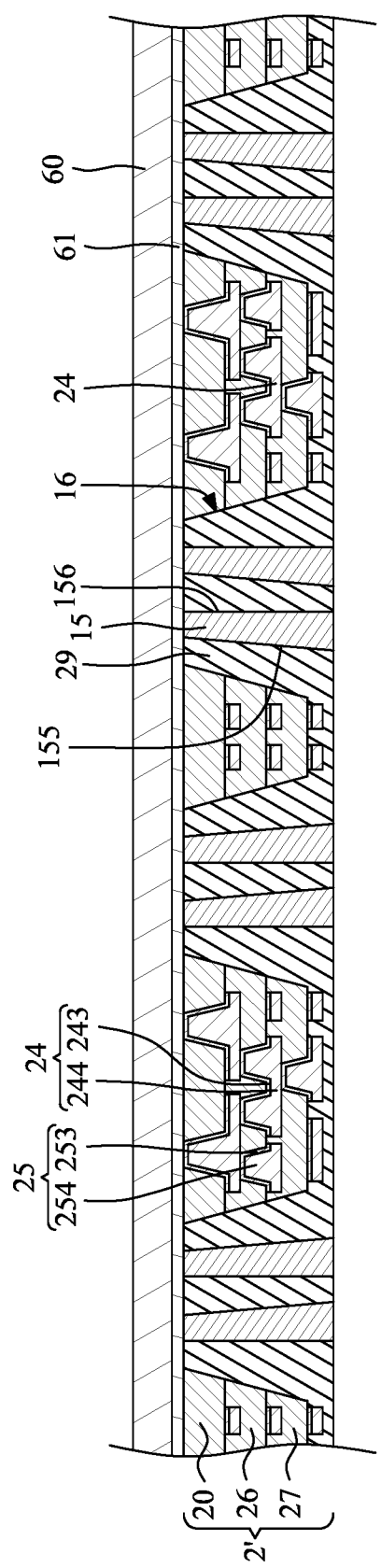
FIG. 19 illustrates one or more stages of an example of a method for manufacturing a wiring structure according to some embodiments of the present disclosure.

In addition, during the manufacturing process, the conductive vias 14 are formed or disposed in the through holes 281 of the insulation material 28 formed from a plurality of pillars 15 (FIG. 19). That is, the pillars 15 (FIG. 19) are formed in a photoresist material 29 (FIG. 19), and then are removed completely to form the empty through holes 281 (FIG. 25), then the conductive vias 14 are formed or disposed in the through holes 281. Thus, a width and a profile of the through holes 281 are defined and limited by the pillars 15 (FIG. 19). As a result, a width of the through hole 281 and a pitch between the through holes 281 may be relatively small, and the through hole 281 may not have a barrel shape. Accordingly, the width of the conductive via 14 and the pitch between the conductive vias 14 may be relatively small, and the conductive via 14 may not have a barrel shape.

Figure 4:
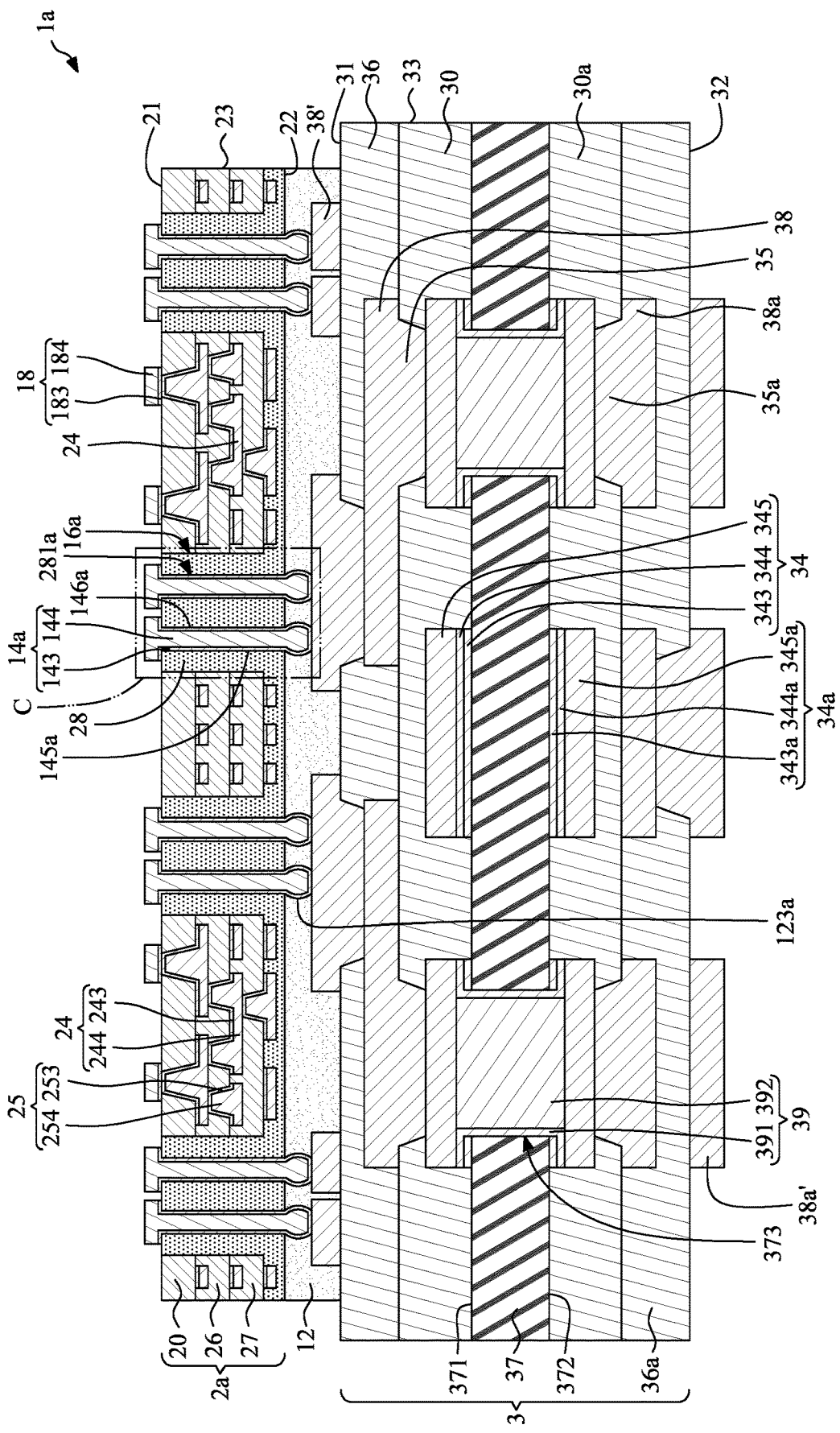
FIG. 4 illustrates a cross-sectional view of a wiring structure according to some embodiments of the present disclosure.
Figure 5:
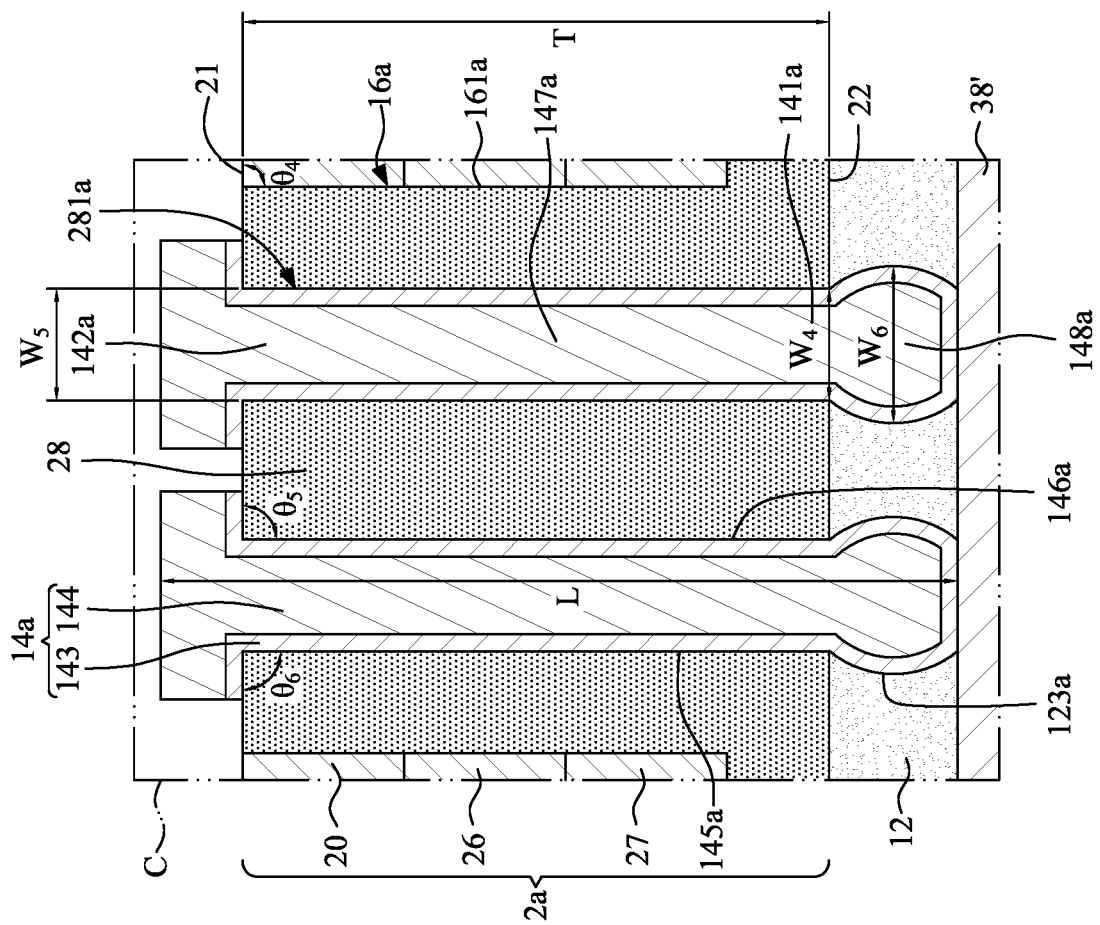
FIG. 5 illustrates a partially enlarged view of a region "C" in FIG. 4.

FIG. 4 illustrates a cross-sectional view of a wiring structure 1a according to some embodiments of the present disclosure. FIG. 5 illustrates a partially enlarged view of a region "C" in FIG. 4. The wiring structure 1a is similar to the wiring structure 1 shown in FIG. 1, except for a structure of the upper conductive structure 2a. The accommodating hole 16a may not taper, and may have a consistent width. An angle $\theta_4$ between the sidewall 161a of the accommodating hole 16a and the top surface 21 of the upper conductive structure 2 may be substantially equal to 90 degrees. The conductive via 14a may include an upper portion 147a in the through hole 281a of the insulation material 28 and a lower portion 148a the through hole 123a of the intermediate layer 12. The first end 141a of the upper portion 147a has a width $W_4$. The second end 142a of the upper portion 147a has a width $W_5$. The width $W_4$ of the first end 141a may be substantially equal to the width $W_5$ of the second end 142a. In addition, the lower portion 148a of the conductive via 14a may have a width $W_6$ that is greater than the width $W_4$ of the first end 141a. The upper portion 147a of the conductive via 14a in the insulation material 28 may not taper, and may have a consistent width. The peripheral side surface of the lower portion 148a of the conductive via 14a may be convex toward the intermediate layer 12. As shown in FIG. 5, an angle $\theta_5$ between the first portion 146a of the peripheral side surface of the upper portion 147a of the conductive via 14a and the top surface 21 of the upper conductive structure 2a may be substantially equal to 90 degrees. An angle $\theta_6$ between the second portion 145a of the peripheral side surface of the upper portion 147a of the conductive via 14a and the top surface 21 of the upper conductive structure 2a may be substantially equal to 90 degrees.

Figure 6:
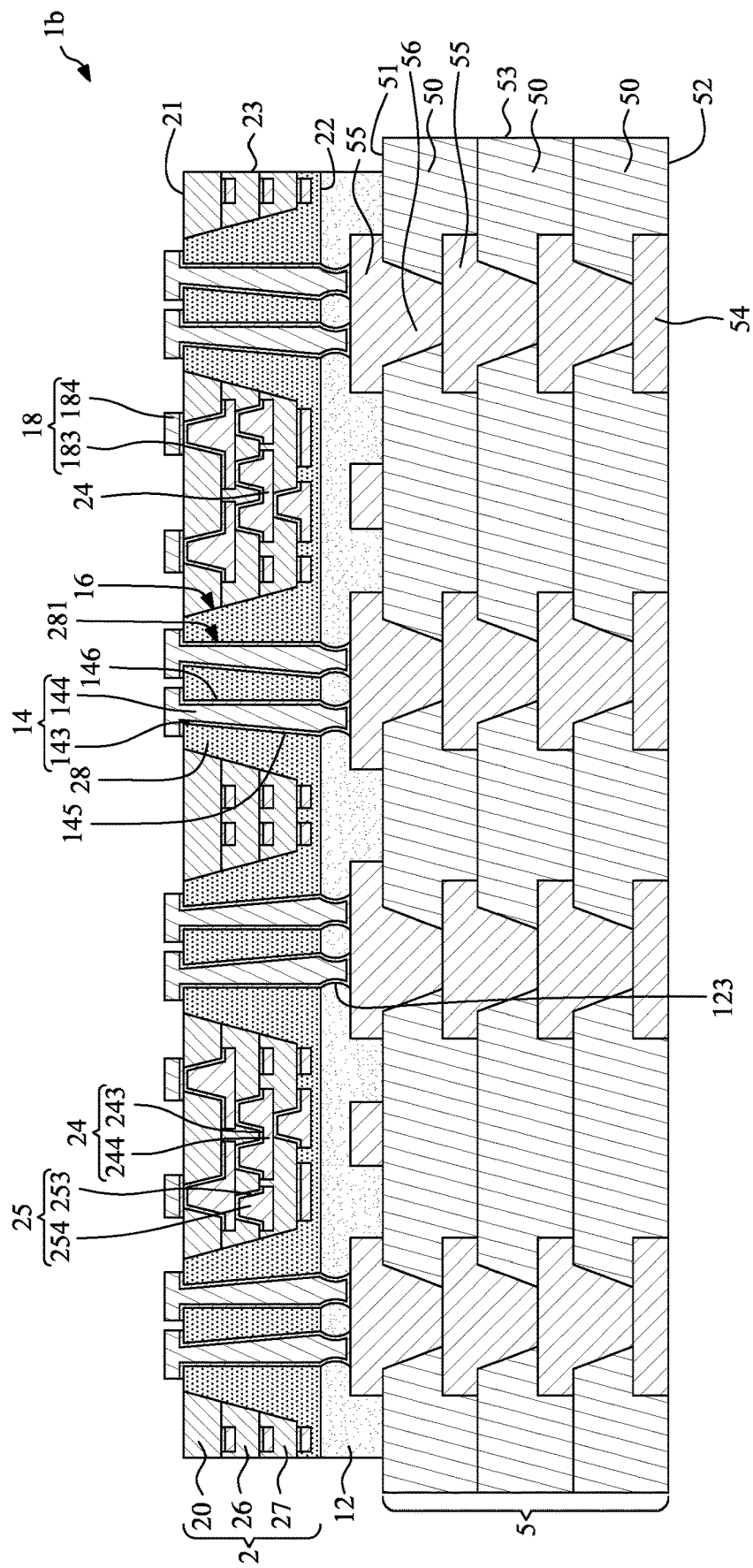
FIG. 6 illustrates a cross-sectional view of a wiring structure according to some embodiments of the present disclosure.

FIG. 6 illustrates a cross-sectional view of a wiring structure 1b according to some embodiments of the present disclosure. The wiring structure 1b is similar to the wiring structure 1 shown in FIG. 1, except for a structure of the lower conductive structure 5. As shown in FIG. 6, the lower conductive structure 5 may be a coreless substrate, and may include at least one dielectric layer (including, for example, three dielectric layers 50), at least one circuit layer (including, for example, three upper circuit layers 55 and one lower circuit layer 54 formed of a metal, a metal alloy, or other conductive material) in contact with the dielectric layer(s) 50 and at least one inner conductive via 56 (including, for example, a plurality of inner conductive vias 56). As shown in FIG. 6, the lower conductive structure 5 has a top surface 51, a bottom surface 52 opposite to the top surface 51, and a lateral surface 53 extending between the top surface 51 and the bottom surface 52. The lateral surface 23 of the upper conductive structure 2 may be displaced or recessed from the lateral surface 53 of the lower conductive structure 5. In some embodiments, the lateral surface 23 of the upper conductive structure 2 may be substantially coplanar with the lateral surface 53 of the lower conductive structure 5.

The lower circuit layer 54 is embedded in the bottommost dielectric layer 50, and exposed from the bottom surface of the bottommost dielectric layer 50. The upper circuit layers 55 are disposed on the dielectric layers 50. Some of the inner conductive vias 56 are disposed between two adjacent upper circuit layers 55 for electrically connecting the two upper circuit layers 55. The inner conductive vias 56 and the upper circuit layer 55 may be formed integrally and concurrently. Some of the inner conductive vias 56 are disposed between the upper circuit layer 55 and the lower circuit layer 54 for electrically connecting the upper circuit layer 55 and the lower circuit layer 54. Each inner conductive via 56 tapers downwardly along a direction from the top surface 51 towards the bottom surface 52 of the lower conductive structure 5. Thus, a tapering direction of the inner conductive via 56 of the lower conductive structure 5 is different from the tapering direction of the inner conductive via 25 of the upper conductive structure 2.

A thickness of each of the second dielectric layers 20, 26, 27 of the upper conductive structure 2 is less than or equal to about 40%, less than or equal to about 35%, or less than or equal to about 30% of a thickness of each of the dielectric layers 50 of the lower conductive structure 5. In addition, a material of the dielectric layers 50 of the lower conductive structure 5 may be different from the material of the second dielectric layers 20, 26, 27 of the upper conductive structure 2. For example, the material of the dielectric layers 50 of the lower conductive structure 5 may be polypropylene (PP) or ajinomoto build-up film (ABF).

An L/S of the upper circuit layer 55 and the lower circuit layer 54 may be greater than or equal to about 10 μm/about 10 μm. Thus, the L/S of the upper circuit layer 55 and the lower circuit layer 54 may be greater than or equal to about three, four, or five times the L/S of the second circuit layer 24 of the upper conductive structure 2. In addition, in some embodiments, the topmost upper circuit layer 55 is disposed on and protrudes from the top surface of the topmost dielectric layer 50 (i.e., the top surface 51 of the lower conductive structure 5).

The intermediate layer 12 is interposed or disposed between the upper conductive structure 2 and the lower conductive structure 5 to bond the upper conductive structure 2 and the lower conductive structure 5 together. In addition, the material of intermediate layer 12 may be different from the material of the dielectric layers 50 the lower conductive structure 5. The conductive via 14 may extend through the intermediate layer 12, and is electrically connected to the topmost upper circuit layer 55 of the lower conductive structure 5.

Figure 6A:
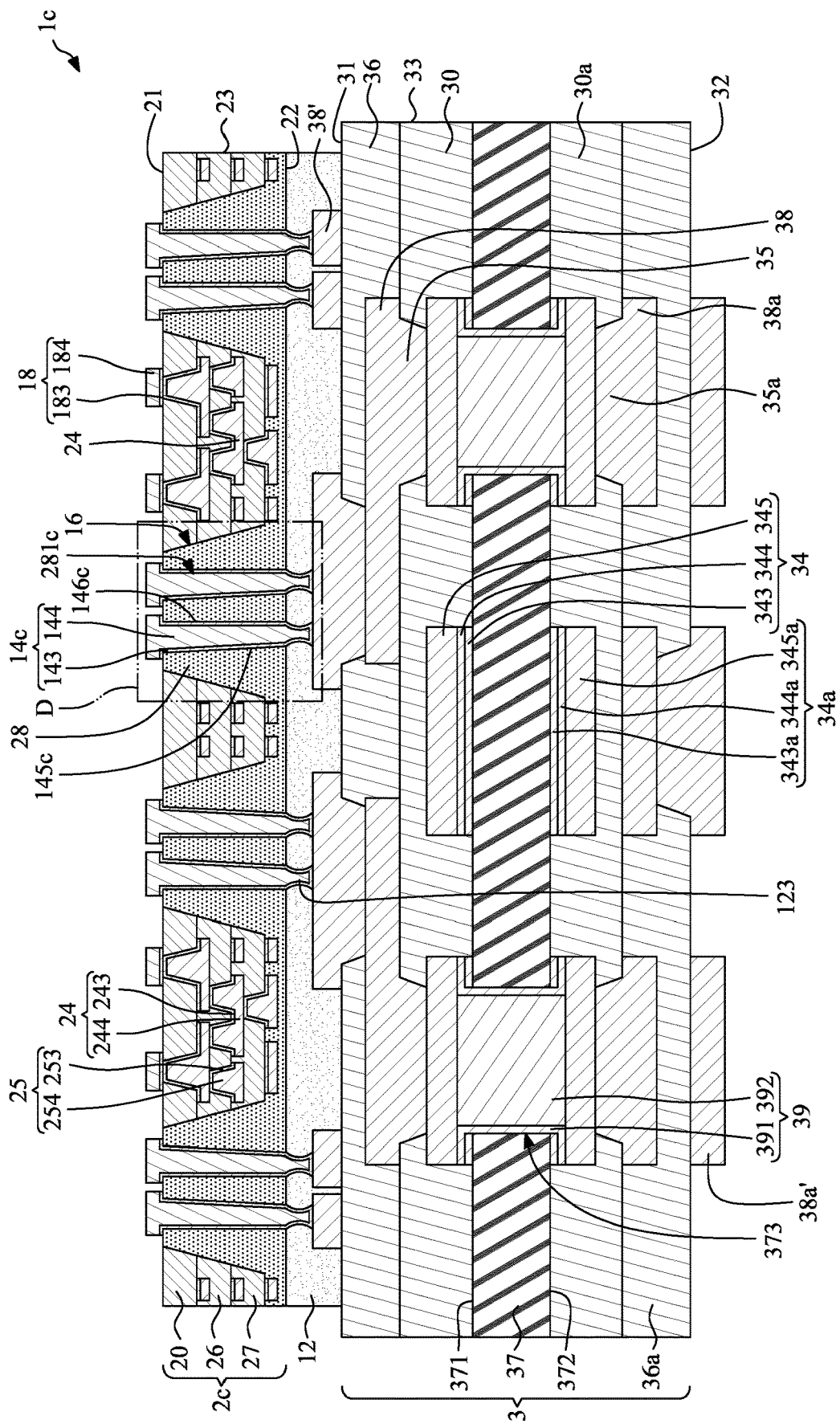
FIG. 6A illustrates a cross-sectional view of a wiring structure according to some embodiments of the present disclosure.
Figure 6B:
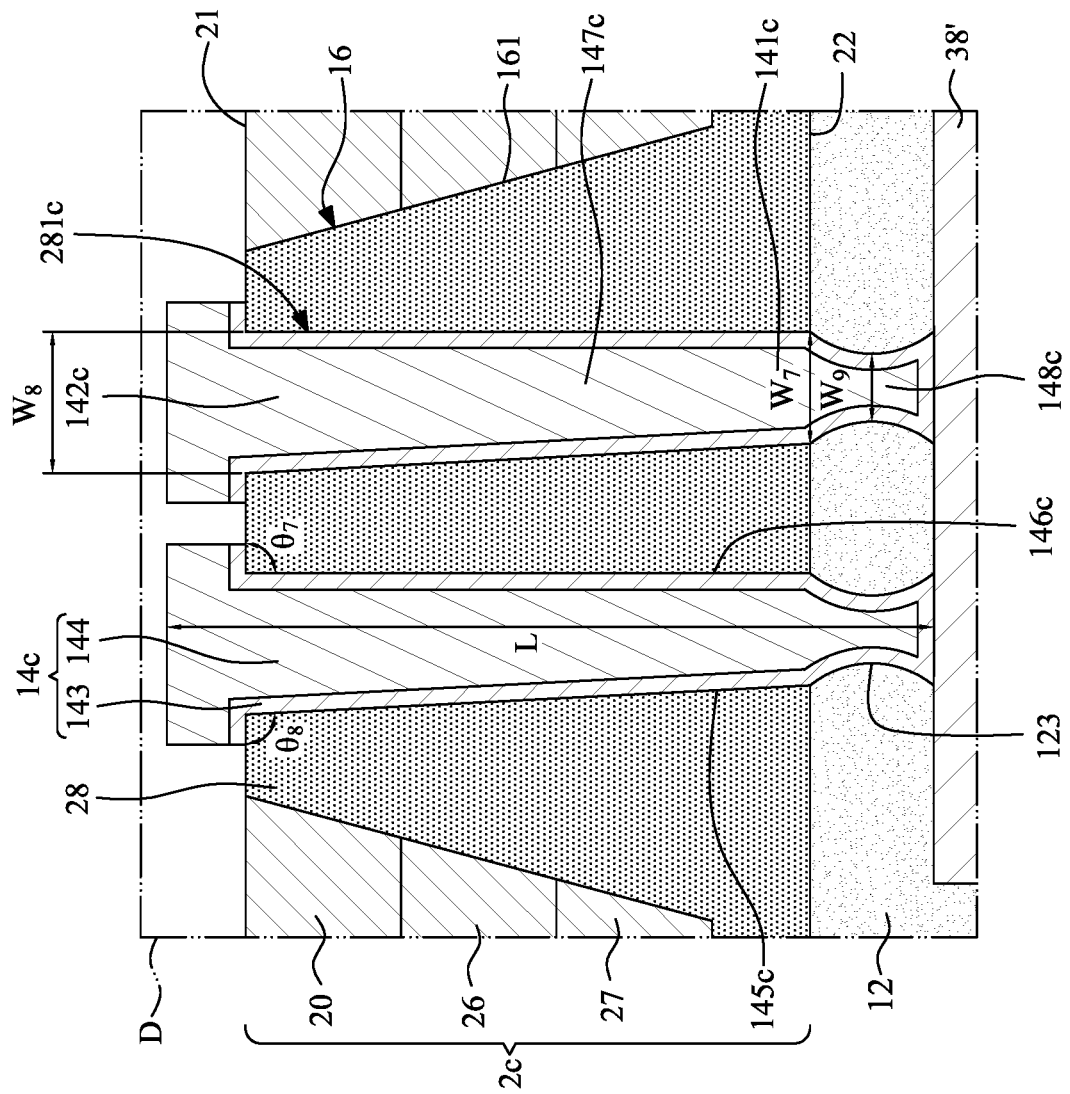
FIG. 6B illustrates a partially enlarged view of a region "D" in FIG. 6A.

FIG. 6A illustrates a cross-sectional view of a wiring structure 1c according to some embodiments of the present disclosure. FIG. 6B illustrates a partially enlarged view of a region "D" in FIG. 6A. The wiring structure 1c is similar to the wiring structure 1 shown in FIG. 1, except for a structure of the conductive via 14c of the upper conductive structure 2c. The conductive via 14c may include an upper portion 147c in the through hole 281c of the insulation material 28 and a lower portion 148c the through hole 123 of the intermediate layer 12. The first end 141c of the upper portion 147c has a width $W_7$. The second end 142c of the upper portion 147c has a width $W_8$. The width $W_7$ of the first end 141c may be less than the width $W_8$ of the second end 142c. In addition, the lower portion 148c of the conductive via 14c may have a width $W_9$ that is less than the width $W_7$ of the first end 141c. The upper portion 147c of the conductive via 14c in the insulation material 28 may taper downwardly along a direction from the top surface 21 towards the bottom surface 22 of the upper conductive structure 2c. As shown in FIG. 6B, an angle $\theta_7$ between the first portion 146c of the peripheral side surface of the upper portion 147c of the conductive via 14c and the top surface 21 of the upper conductive structure 2c may be substantially equal to 90 degrees. An angle $\theta_8$ between the second portion 145c of the peripheral side surface of the upper portion 147c of the conductive via 14c and the top surface 21 of the upper conductive structure 2c may be greater than 90 degrees.

Figure 6C:
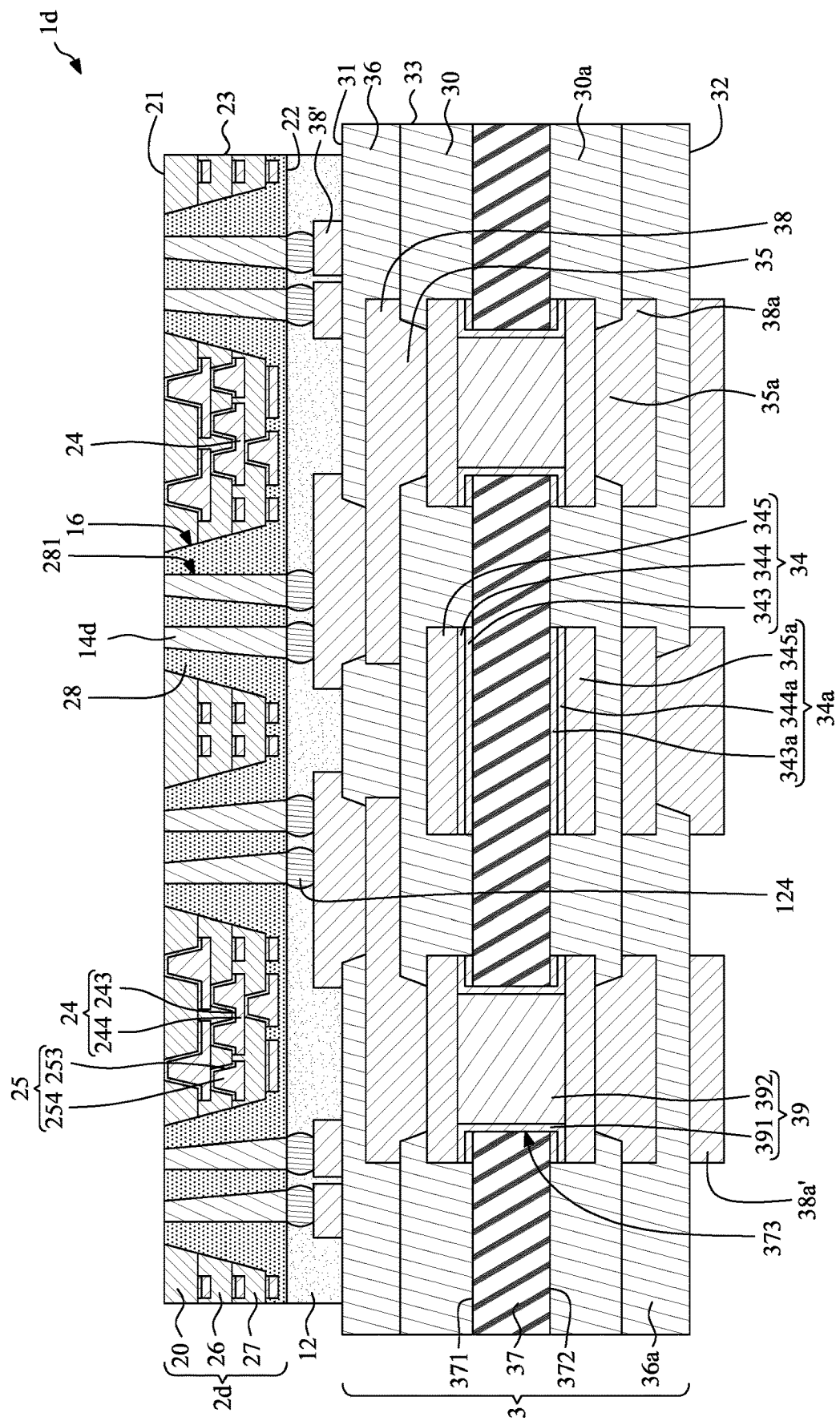
FIG. 6C illustrates a cross-sectional view of a wiring structure $1d$ according to some embodiments of the present disclosure.

FIG. 6C illustrates a cross-sectional view of a wiring structure 1d according to some embodiments of the present disclosure. The wiring structure 1d is similar to the wiring structure 1 shown in FIG. 1, except for a structure of the conductive via 14d of the upper conductive structure 2d. The conductive via 14d may be a preformed pillar. Alternatively the conductive via 14d may be formed by plating. A top surface of the conductive via 14d may be substantially coplanar with the top surface 21 of the upper conductive structure 2d. A bottom surface of the conductive via 14d may be substantially coplanar with the bottom surface 22 of the upper conductive structure 2d. The upper conductive structure 2d is bonded to the lower conductive structure 3 through flip-chip bonding. That is, the conductive via 14d is bonded to the lower conductive structure 3 through the solder material 124. The intermediate layer 12 may be an underfill that covers and protects the solder material 124.

Figure 7:
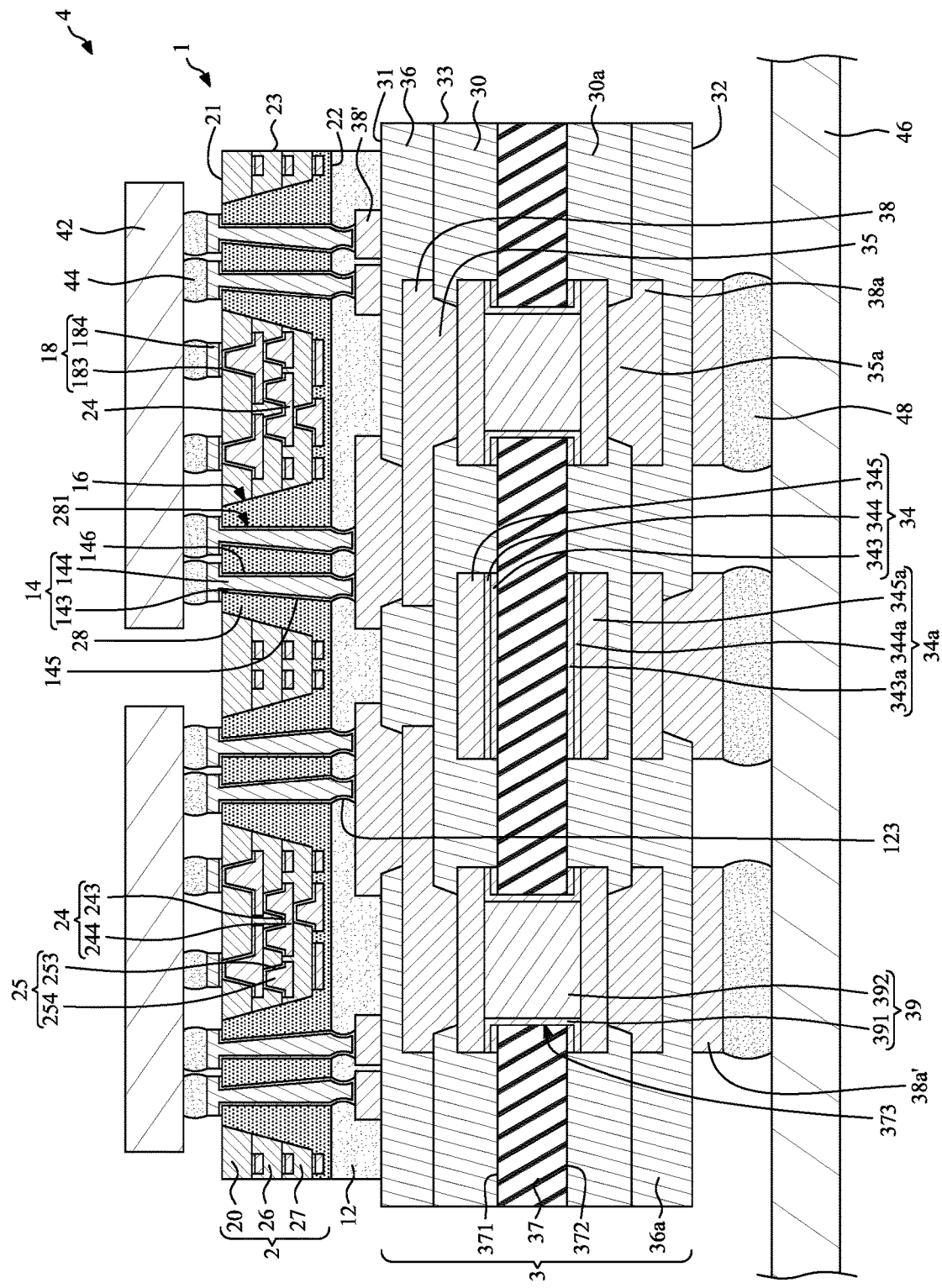
FIG. 7 illustrates a cross-sectional view of a bonding of a package structure and a substrate according to some embodiments of the present disclosure.

FIG. 7 illustrates a cross-sectional view of a bonding of a package structure 4 and a substrate 46 according to some embodiments of the present disclosure. The package structure 4 includes a wiring structure 1, at least one electronic device 42, a plurality of first connecting elements 44 and a plurality of second connecting elements 48. The wiring structure 1 of FIG. 7 is similar to the wiring structure 1 shown in FIG. 1. The electronic device 42 is electrically connected and bonded to the outer circuit layer 18 and the upper conductive structure 2 through the first connecting elements 44 (e.g., solder bumps or other conductive bumps). As shown in FIG. 7, the electronic device 42 is disposed on the upper conductive structure 2, and is electrically connected to the lower conductive structure 3 through the conductive via 14. The electronic device 42 may be a semiconductor bare die or a semiconductor chip. For example, the electronic device 42 may include a high bandwidth memory (HBM) die and/or an application specific integrated circuit (ASIC) die. The second lower circuit layer 38a' of the lower conductive structure 3 is electrically connected and bonded to the substrate 46 (e.g., a mother board such as a printed circuit board (PCB)) through the second connecting elements 48 (e.g., solder bumps or other conductive bumps).

FIG. 8 through FIG. 28 illustrate a method for manufacturing a wiring structure according to some embodiments of the present disclosure. In some embodiments, the method is for manufacturing the wiring structure 1 shown in FIG. 1.

Figure 8:
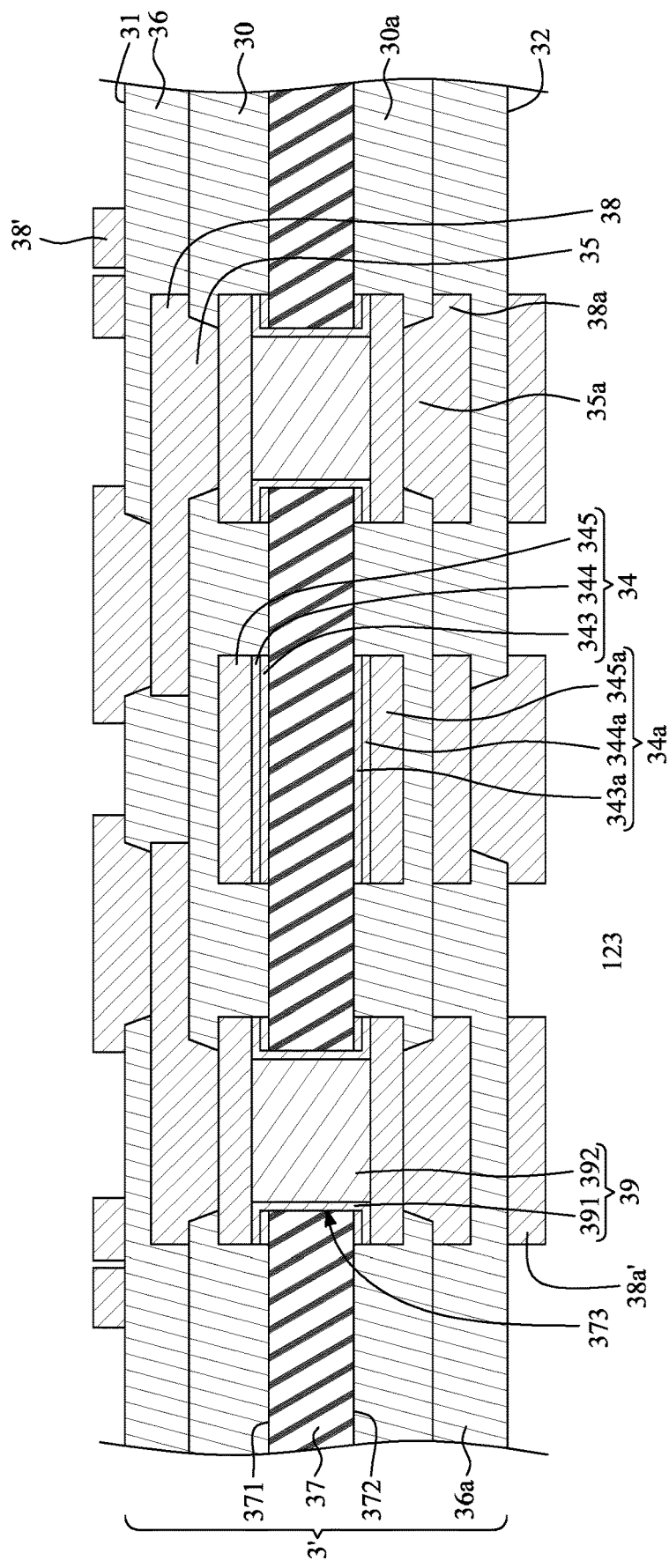
FIG. 8 illustrates one or more stages of an example of a method for manufacturing a wiring structure according to some embodiments of the present disclosure.

Referring to FIG. 8, a lower conductive structure 3' is provided. The lower conductive structure 3' is similar to the lower conductive structure 3 of FIG. 1, and includes the first dielectric layers 30, 36, 30a, 36a, the first circuit layers 34, 38, 38', 34a, 38a, 38a', the core portion 37, the upper interconnection vias 35 and the lower interconnection vias 35a. An electrical property (such as open circuit/short circuit) of the lower conductive structure 3' may be tested.

Figure 9:
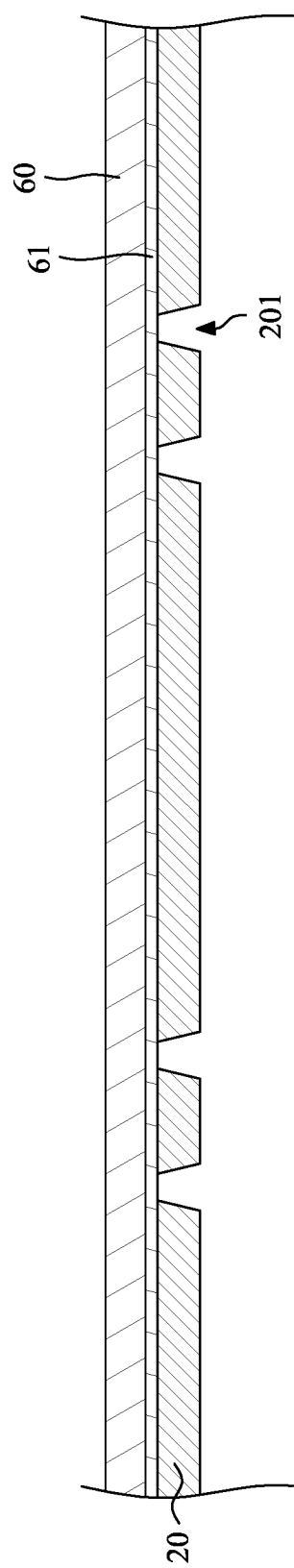
FIG. 9 illustrates one or more stages of an example of a method for manufacturing a wiring structure according to some embodiments of the present disclosure.

Referring to FIG. 9 through FIG. 22, an upper conductive structure 2 is provided. The upper conductive structure 2 is manufactured as follows. Referring to FIG. 9, a carrier 60 is provided. The carrier 60 may be a glass carrier, and may be in a wafer type, a panel type or a strip type. Then, a seed layer 61 is formed on the carrier 60. Then, a patterned second dielectric layer 20 is formed on the seed layer 61 on the carrier 60. The patterned second dielectric layer 20 defines at least one opening 201 extending through the second dielectric layer 20.

Figure 10:
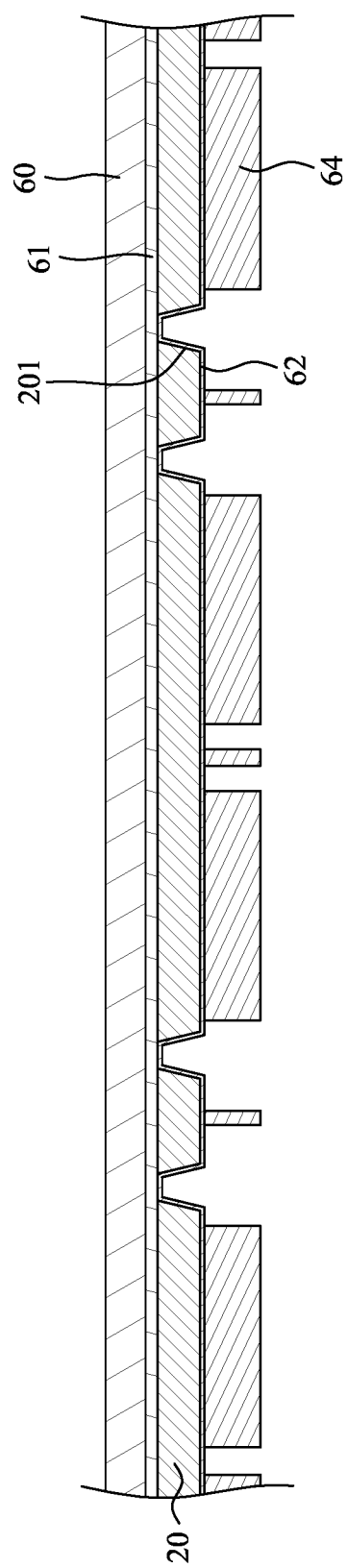
FIG. 10 illustrates one or more stages of an example of a method for manufacturing a wiring structure according to some embodiments of the present disclosure.

Referring to FIG. 10, a seed layer 62 is formed or disposed on the second dielectric layer 20 and in the opening 201 by a physical vapor deposition (PVD) technique or other suitable techniques. Then, a first photoresist layer 64 is formed or disposed on the seed layer 62. Then, the first photoresist layer 64 is patterned to form a plurality of openings to expose portions of the seed layer 62 by an exposure and development technique or other suitable techniques.

Figure 11:
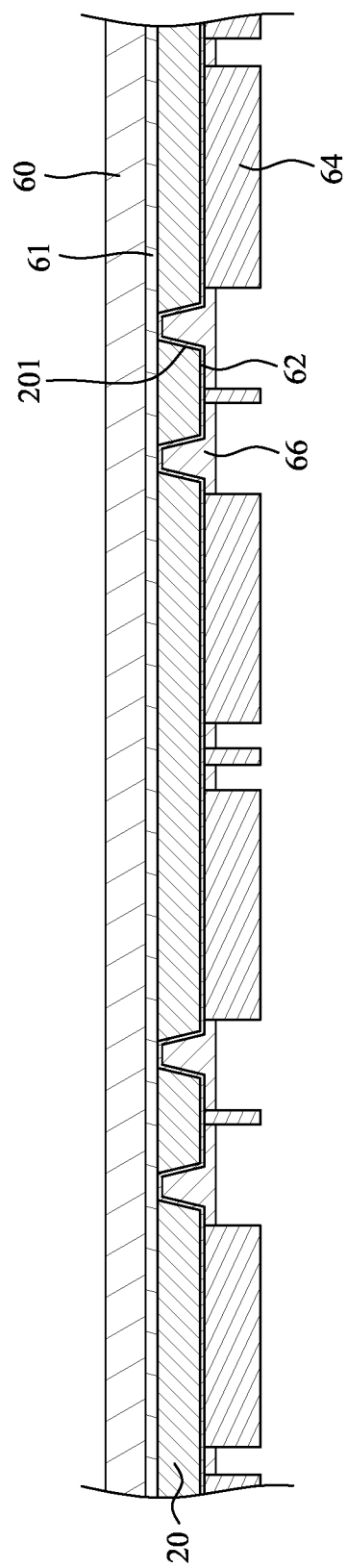
FIG. 11 illustrates one or more stages of an example of a method for manufacturing a wiring structure according to some embodiments of the present disclosure.

Referring to FIG. 11, a conductive material 66 (e.g., a metallic material) is disposed in the openings of the first photoresist layer 64 and on the seed layer 62 by a plating technique or other suitable techniques.

Figure 12:
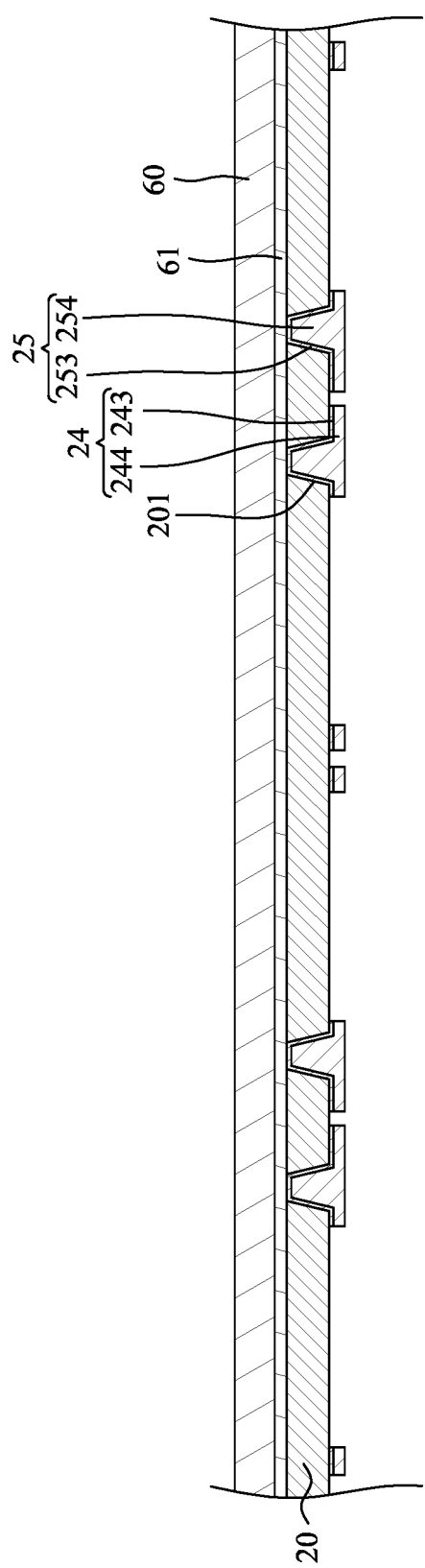
FIG. 12 illustrates one or more stages of an example of a method for manufacturing a wiring structure according to some embodiments of the present disclosure.

Referring to FIG. 12, the first photoresist layer 64 is removed by a stripping technique or other suitable techniques. Then, portions of the seed layer 62 that are not covered by the conductive material 66 are removed by an etching technique or other suitable techniques. Meanwhile, a second circuit layer 24 and at least one inner conductive via 25 are formed. The second circuit layer 24 is disposed on a bottom surface of the second dielectric layer 20, and include a seed layer 243 formed from the seed layer 62 and a conductive material 244 disposed on the seed layer 243 and formed from the conductive material 66. The inner conductive via 25 is disposed in the opening 201 of the second dielectric layer 20, and includes a seed layer 253 formed from the seed layer 62 and a conductive material 254 disposed on the seed layer 253 and formed from the conductive material 66.

Figure 13:
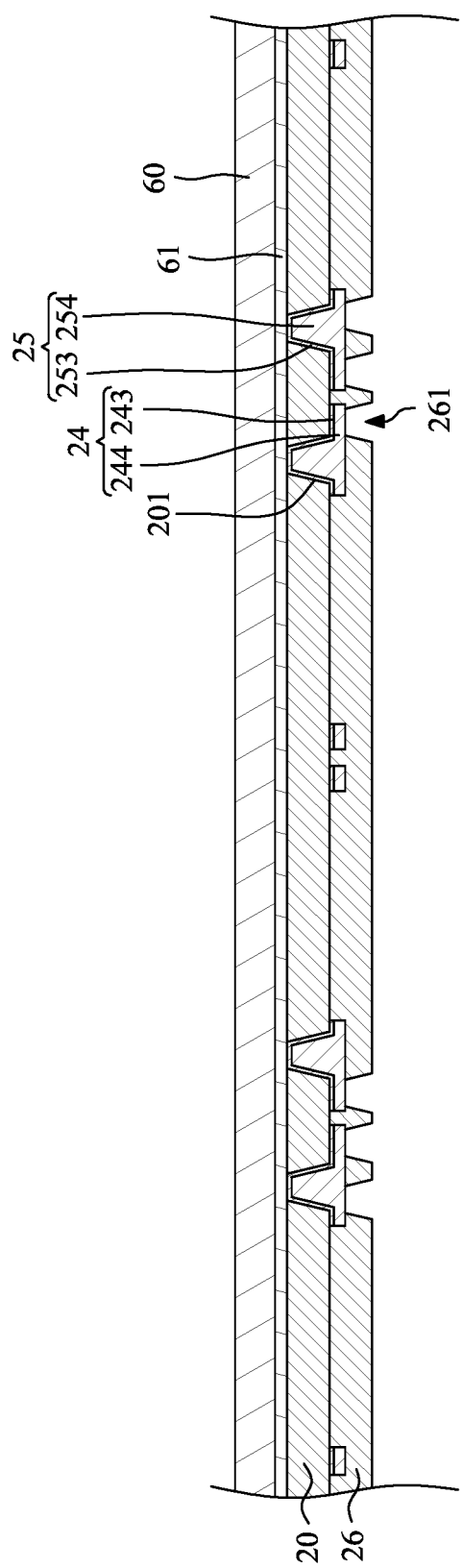
FIG. 13 illustrates one or more stages of an example of a method for manufacturing a wiring structure according to some embodiments of the present disclosure.

Referring to FIG. 13, a patterned second dielectric layer 26 is formed on the second dielectric layer 20 to cover the second circuit layer 24. The patterned second dielectric layer 26 defines at least one opening 261 extending through the second dielectric layer 26 so as to expose a portion of the second circuit layer 24.

Figure 14:
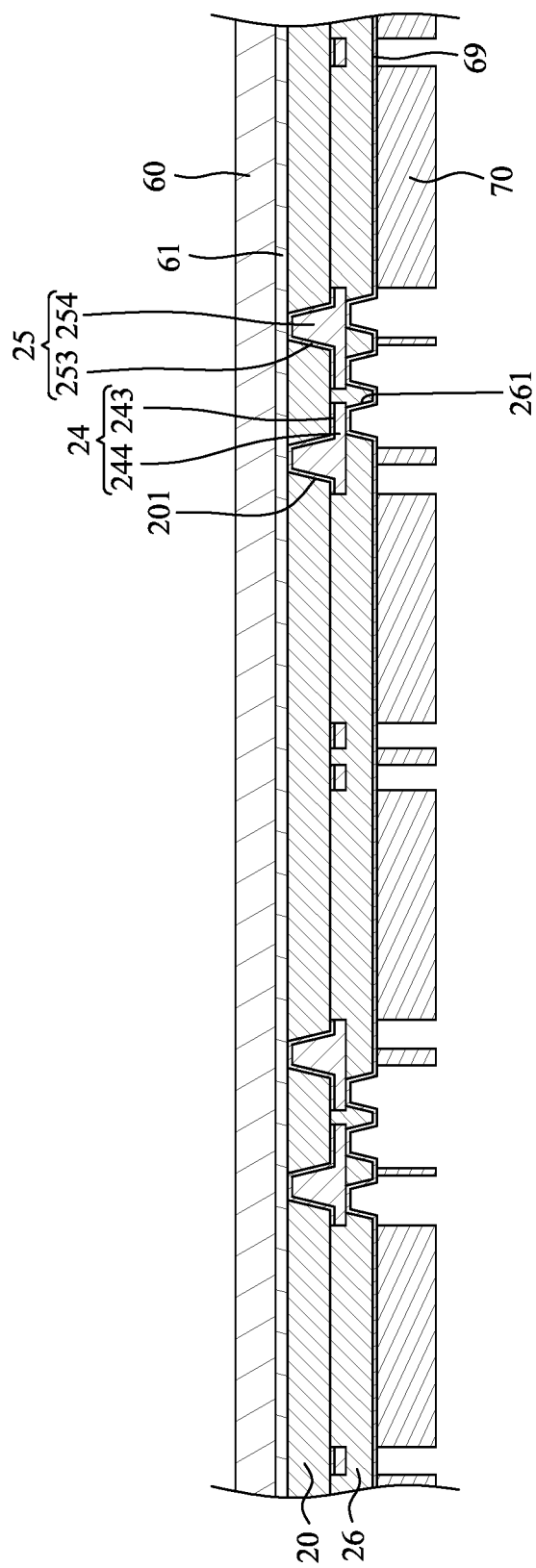
FIG. 14 illustrates one or more stages of an example of a method for manufacturing a wiring structure according to some embodiments of the present disclosure.

Referring to FIG. 14, a seed layer 69 is formed or disposed on the second dielectric layer 26 and in the opening 261 by a physical vapor deposition (PVD) technique or other suitable techniques. Then, a second photoresist layer 70 is formed or disposed on the seed layer 69. Then, the second photoresist layer 70 is patterned to form a plurality of openings to expose portions of the seed layer 69 by an exposure and development technique or other suitable techniques.

Figure 15:
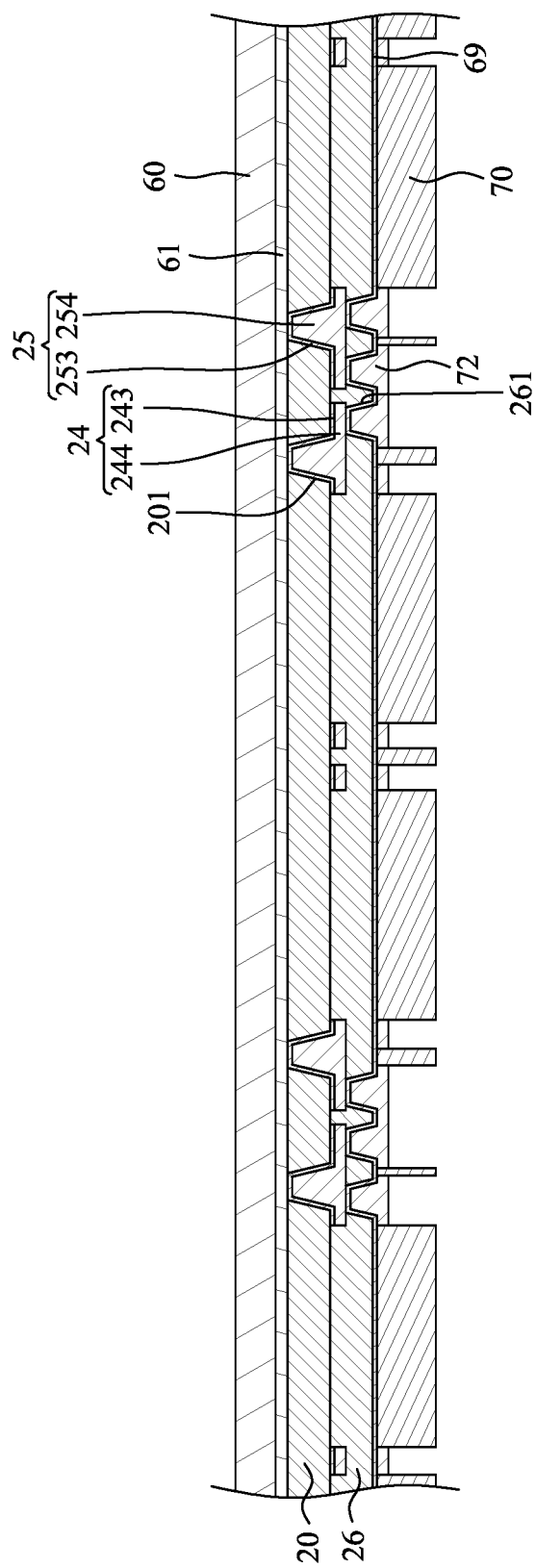
FIG. 15 illustrates one or more stages of an example of a method for manufacturing a wiring structure according to some embodiments of the present disclosure.

Referring to FIG. 15, a conductive material 72 (e.g., a metallic material) is disposed in the openings of the second photoresist layer 70 and on the seed layer 69 by a plating technique or other suitable techniques.

Figure 16:
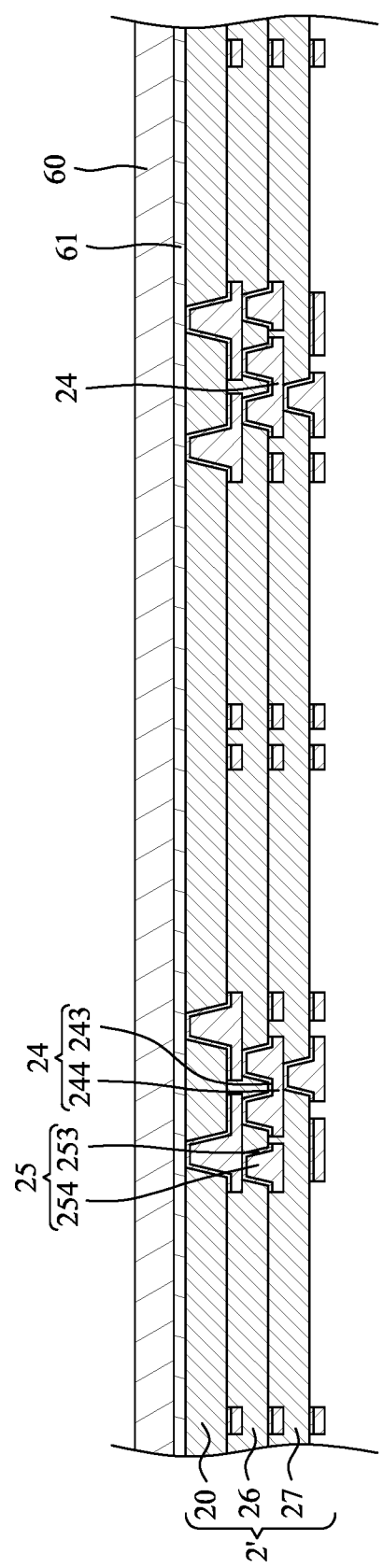
FIG. 16 illustrates one or more stages of an example of a method for manufacturing a wiring structure according to some embodiments of the present disclosure.

Referring to FIG. 16, the second photoresist layer 70 is removed by a stripping technique or other suitable techniques. Then, portions of the seed layer 69 that are not covered by the conductive material 72 are removed by an etching technique or other suitable techniques. Meanwhile, a second circuit layer 24 and at least one inner conductive via 25 are formed. The second circuit layer 24 is disposed on a bottom surface of the second dielectric layer 26, and include a seed layer 243 formed from the seed layer 69 and a conductive material 244 disposed on the seed layer 243 and formed from the conductive material 72. The inner conductive via 25 is disposed in the opening 261 of the second dielectric layer 26, and includes a seed layer 253 formed from the seed layer 69 and a conductive material 254 disposed on the seed layer 253 and formed from the conductive material 72. Then, the stages illustrated in FIG. 13 to FIG. 16 are repeated to form a patterned second dielectric layer 27, the second circuit layer 24 on the second dielectric layer 27 and the inner conductive via 25 extending through the second dielectric layer 27. Meanwhile, an upper conductive structure 2' is formed on the carrier 60. The upper conductive structure 2' may be tested.

Figure 17:
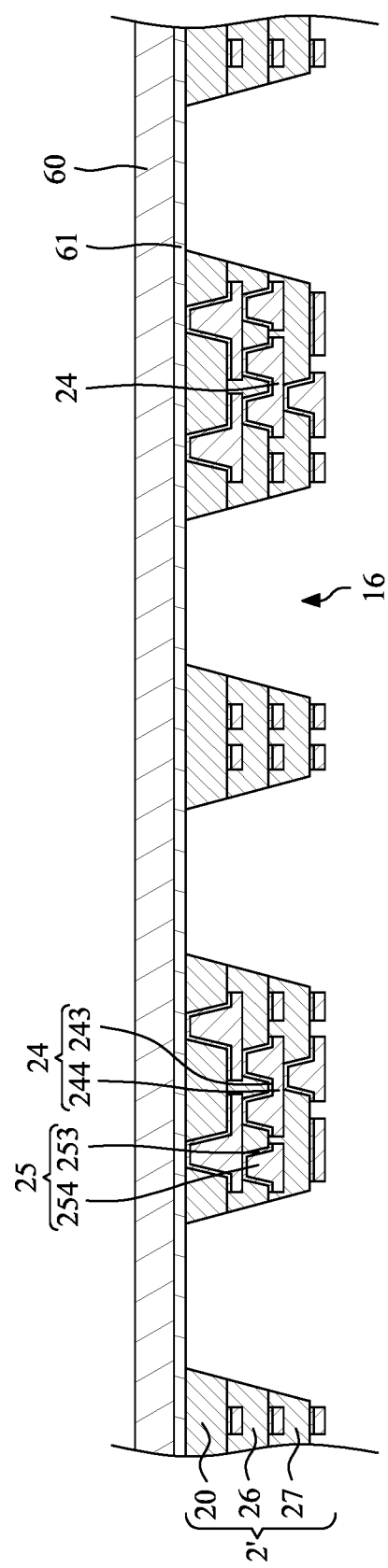
FIG. 17 illustrates one or more stages of an example of a method for manufacturing a wiring structure according to some embodiments of the present disclosure.

Referring to FIG. 17, at least one accommodating hole 16 is formed by, for example, organic etching or laser drilling, to extend through the upper conductive structure 2' (including the second dielectric layers 20, 26, 27). The accommodating hole 16 may taper upwardly. Thus, the upper conductive structure 2' defines the accommodating hole 16.

Figure 18:
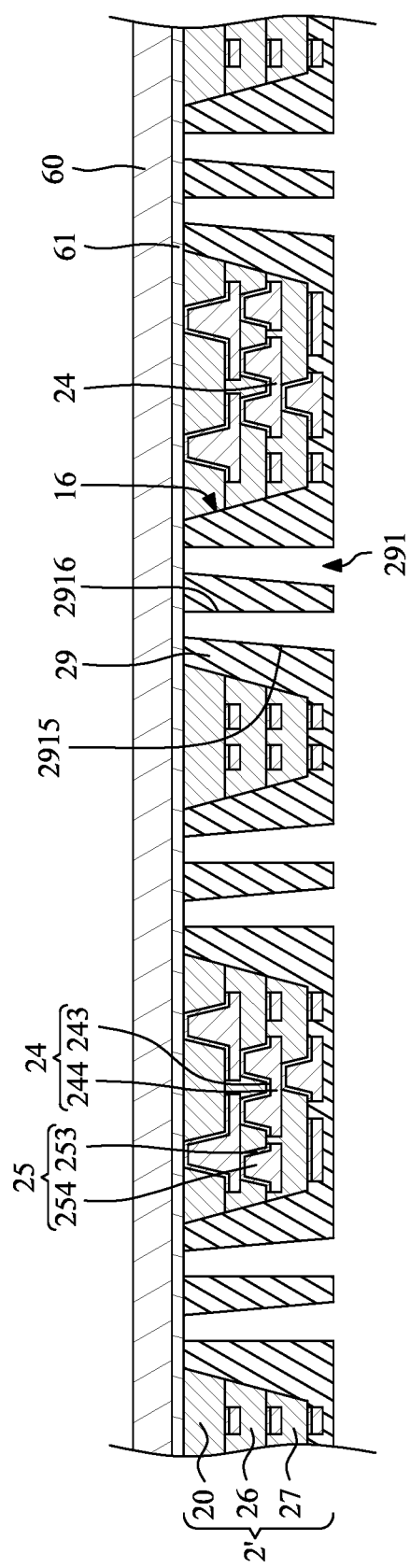
FIG. 18 illustrates one or more stages of an example of a method for manufacturing a wiring structure according to some embodiments of the present disclosure.

Then, at least one pillar 15 may be provided (e.g., formed or disposed) in the accommodating hole 16 as follows. Referring to FIG. 18, a photoresist material 29 is formed or disposed in the accommodating hole 16. In some embodiments, the photoresist material 29 may cover and contact the bottom surface of the bottommost second dielectric layer 27 and the bottommost second circuit layer 24. Then, at least one through hole 291 may be formed to extend through the photoresist material 29 in the accommodating hole 16 by, for example, a lithography process (e.g., exposure and development). An angle between a first portion 2916 of the sidewall of the through hole 291 and the top surface of the upper conductive structure 2' may be substantially equal to 90 degrees. An angle between a second portion 2915 of the sidewall of the through hole 291 and the top surface of the upper conductive structure 2' may be less than 90 degrees.

Referring to FIG. 19, a filling material (e.g., metal material) is formed or disposed to fill the through hole 291 of the photoresist material 29 to form the pillar 15 in the through hole 291 by, for example, plating. The pillar 15 may be formed by plating with a mask patterned by a lithography process. An angle between a first portion 156 of the peripheral side surface of the pillar 15 and the top surface of the upper conductive structure 2' may be substantially equal to 90 degrees. An angle between a second portion 155 of the peripheral side surface of the pillar 15 and the top surface 21 of the upper conductive structure 2' may be less than 90 degrees.

Figure 20:
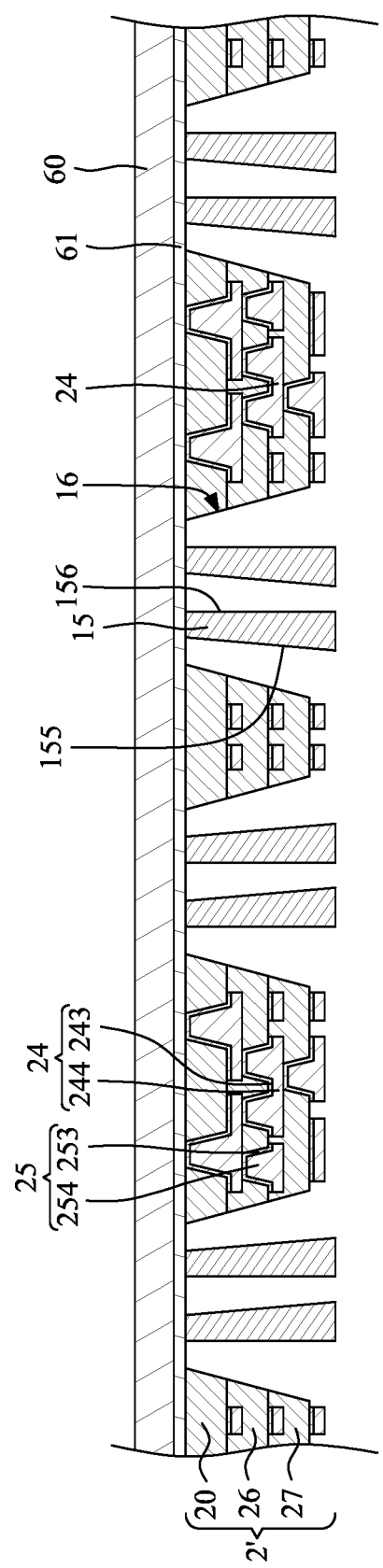
FIG. 20 illustrates one or more stages of an example of a method for manufacturing a wiring structure according to some embodiments of the present disclosure.

Referring to FIG. 20, the photoresist material 29 is removed.

Figure 21:
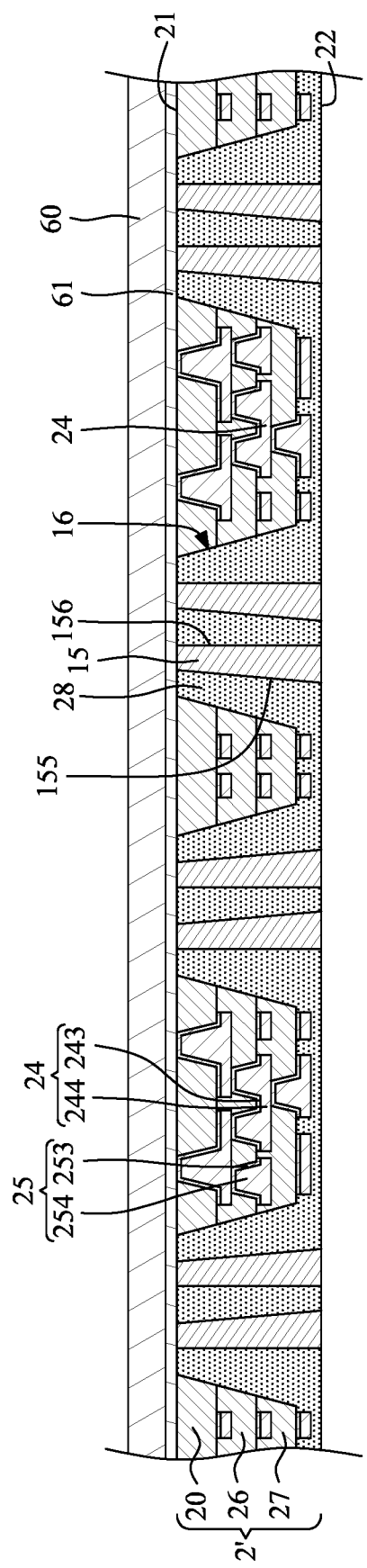
FIG. 21 illustrates one or more stages of an example of a method for manufacturing a wiring structure according to some embodiments of the present disclosure.

Referring to FIG. 21, an insulation material 28 is formed or disposed in the accommodating hole 16 to cover the pillar 15. In some embodiments, the insulation material 28 may cover and contact the bottom surface of the bottommost second dielectric layer 27 and the bottommost second circuit layer 24. In some embodiments, a bottom surface of the insulation material 28 may be ground to expose the pillar 15. Thus, the bottom surface of the insulation material 28 may be substantially coplanar with the bottom surface of the pillar 15.

Figure 22:
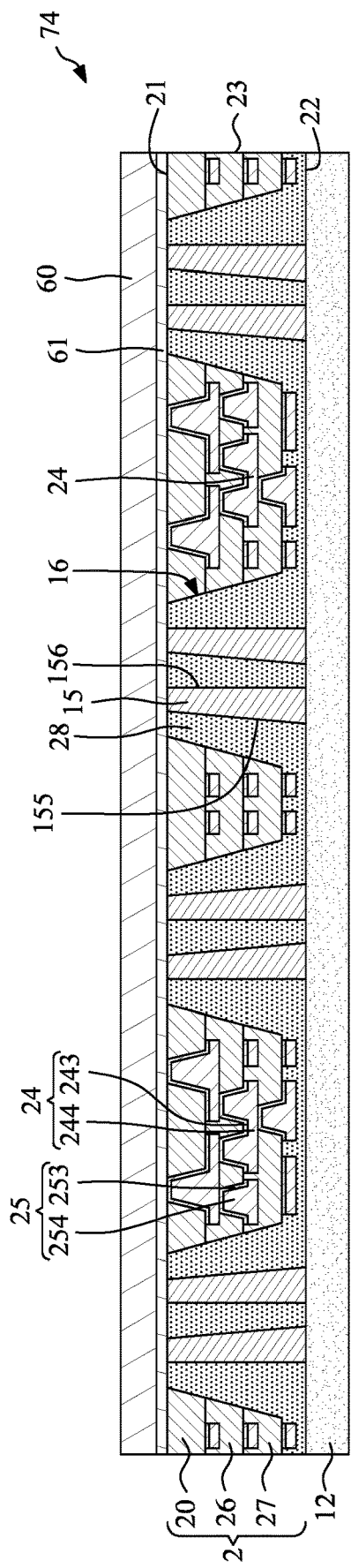
FIG. 22 illustrates one or more stages of an example of a method for manufacturing a wiring structure according to some embodiments of the present disclosure.

Referring to FIG. 22, the upper conductive structure 2' and the carrier 60 are cut to form a plurality of unit structures 74. The unit structure 74 includes an upper conductive structure 2 and a portion of the carrier 60. The upper conductive structure 2 of FIG. 22 may be the upper conductive structure 2 of FIG. 1. Then, an adhesive layer 12 is formed or applied on the bottom surface 22 of the upper conductive structure 2 to cover and contact the insulation material 28.

Figure 23:
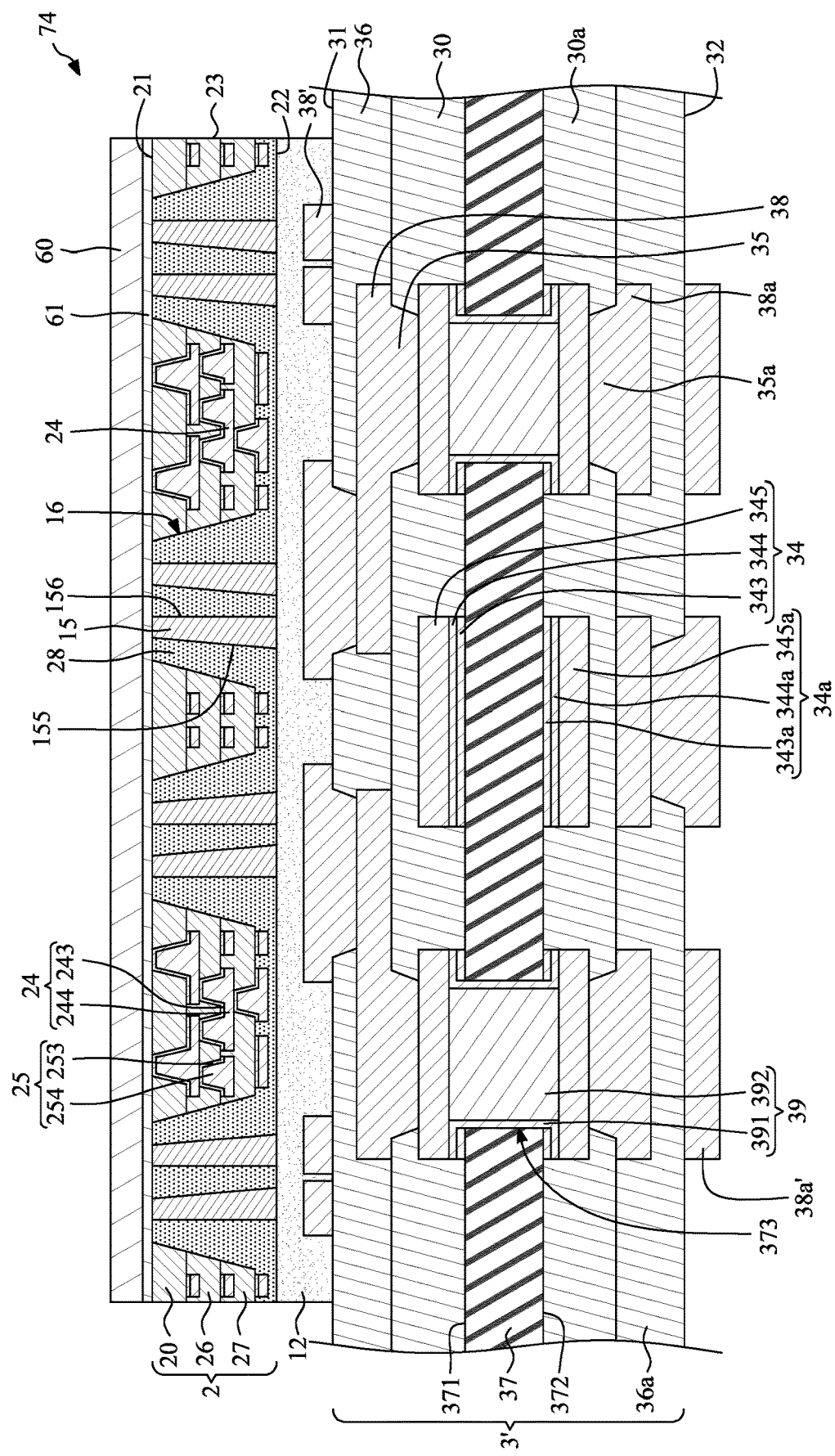
FIG. 23 illustrates one or more stages of an example of a method for manufacturing a wiring structure according to some embodiments of the present disclosure.

Referring to FIG. 23, the unit structure 74 is attached to the lower conductive structure 3' of FIG. 8. The upper conductive structure 2 faces the lower conductive structure 3'. Thus, the upper conductive structure 2 with the pillar 15 and the carrier 60 are attached to the lower conductive structure 3' through the adhesive layer 12. Then, the adhesive layer 12 is cured to form an intermediate layer 12.

Figure 24:
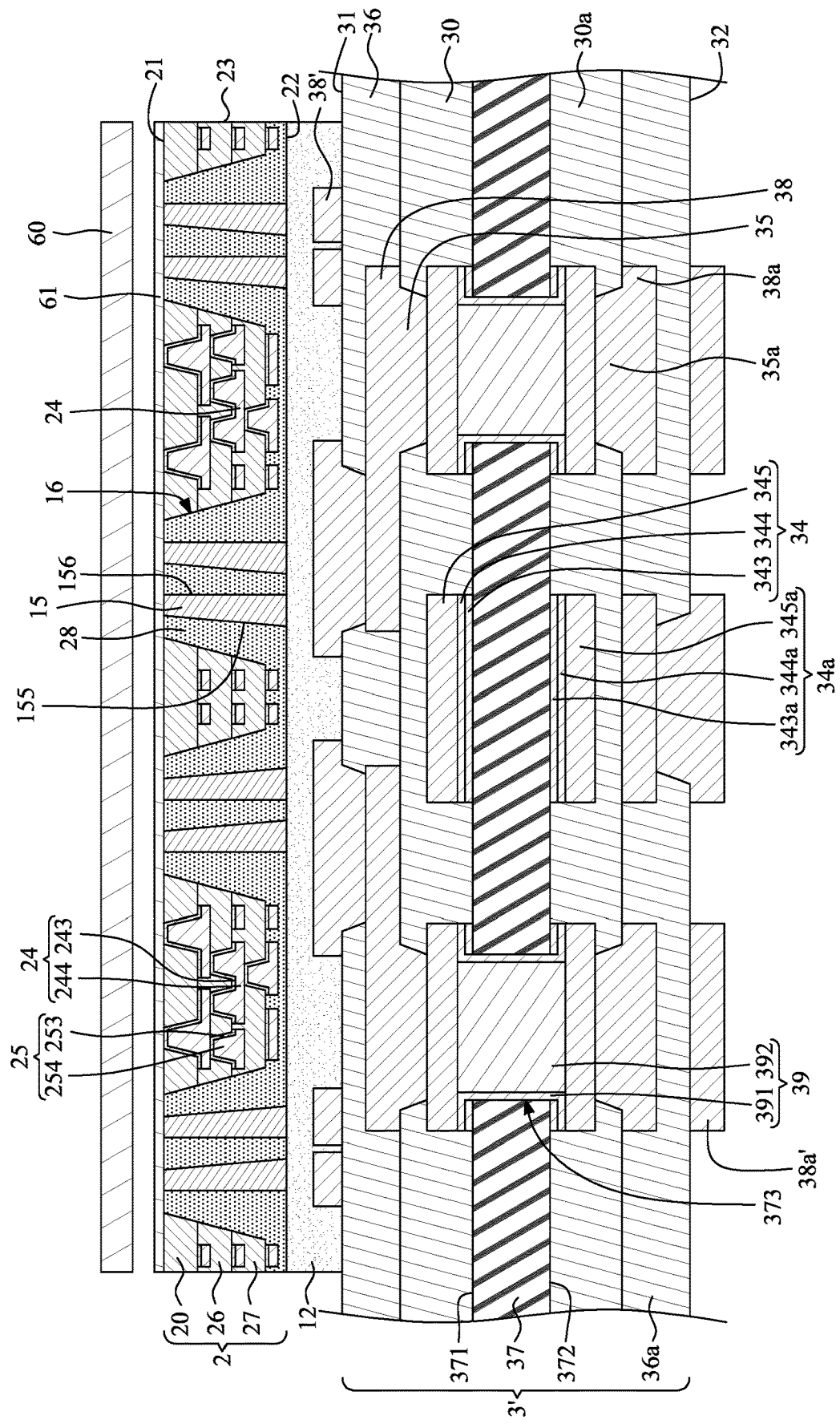
FIG. 24 illustrates one or more stages of an example of a method for manufacturing a wiring structure according to some embodiments of the present disclosure.

Referring to FIG. 24, the carrier 60 is removed.

Figure 25:
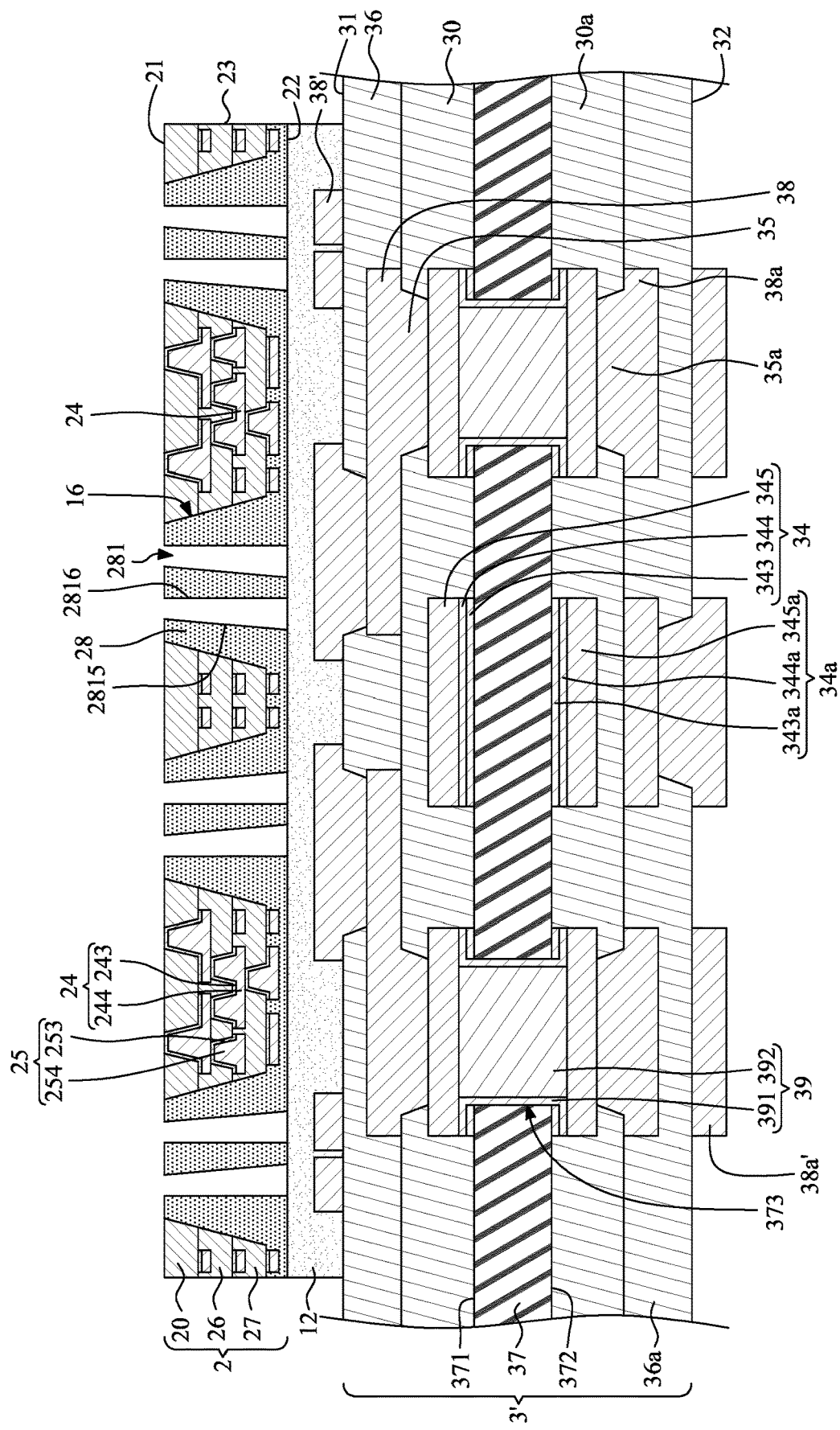
FIG. 25 illustrates one or more stages of an example of a method for manufacturing a wiring structure according to some embodiments of the present disclosure.

Referring to FIG. 25, the seed layer 61 is removed. Then, the pillar 15 is removed by, for example, wet etching, so as to form an empty through hole 281 in the insulation material 28. An angle between a first portion 2816 of the sidewall of the through hole 281 and the top surface 21 of the upper conductive structure 2 may be substantially equal to 90 degrees. An angle between a second portion 2815 of the sidewall of the through hole 281 and the top surface 21 of the upper conductive structure 2 may be less than 90 degrees.

Figure 26:
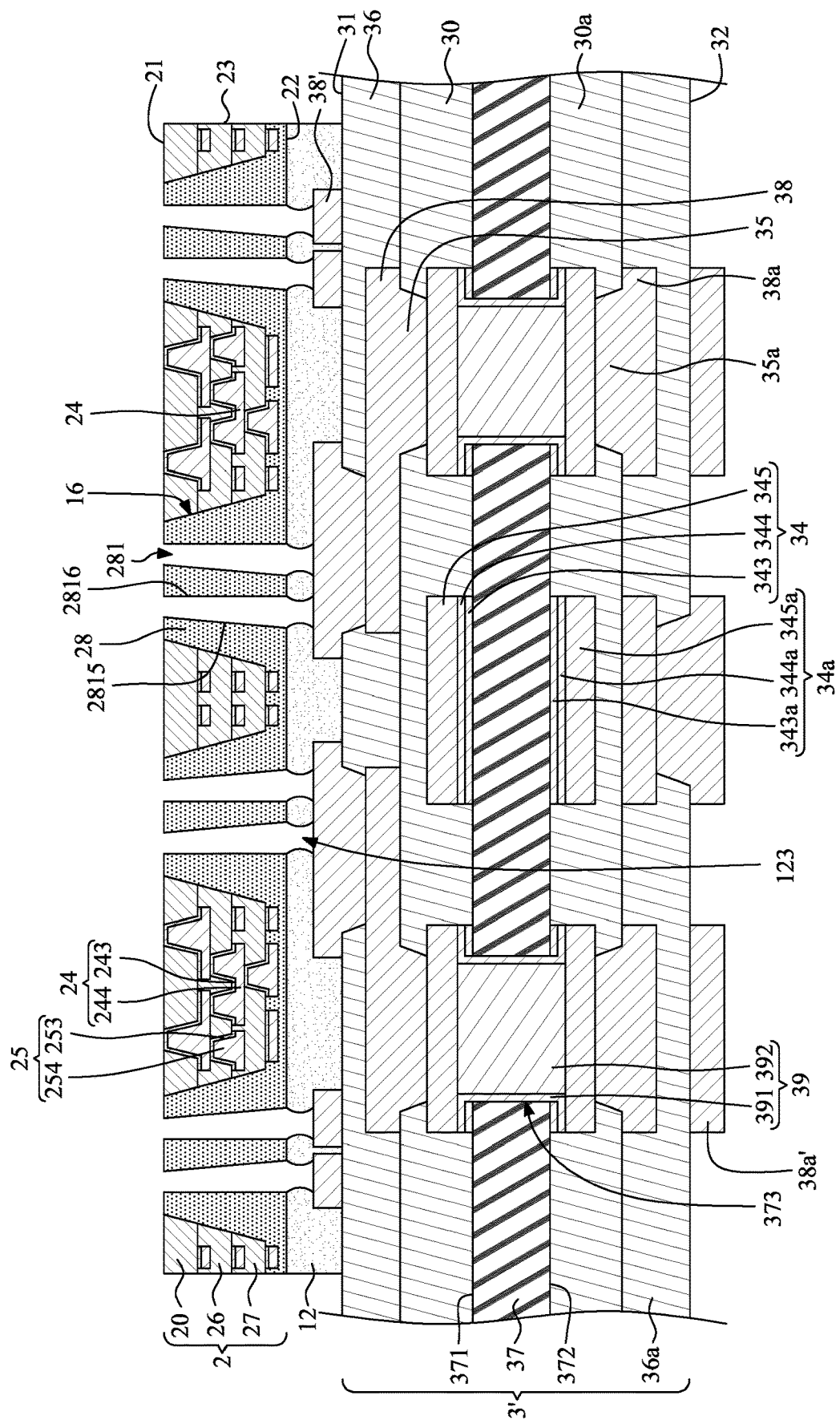
FIG. 26 illustrates one or more stages of an example of a method for manufacturing a wiring structure according to some embodiments of the present disclosure.

Referring to FIG. 26, a portion of the intermediate layer 12 under the through hole 281 is removed to form a through hole 123 in the intermediate layer 12. Thus, the through hole 123 of the intermediate layer 12 may be aligned with and in communication with the through hole 281 of the insulation material 28 of the upper conductive structure 2. Meanwhile, a portion of the topmost first circuit layer (e.g., the top surface of the first upper circuit layer 38') of the lower conductive structure 3' is exposed.

Figure 27:
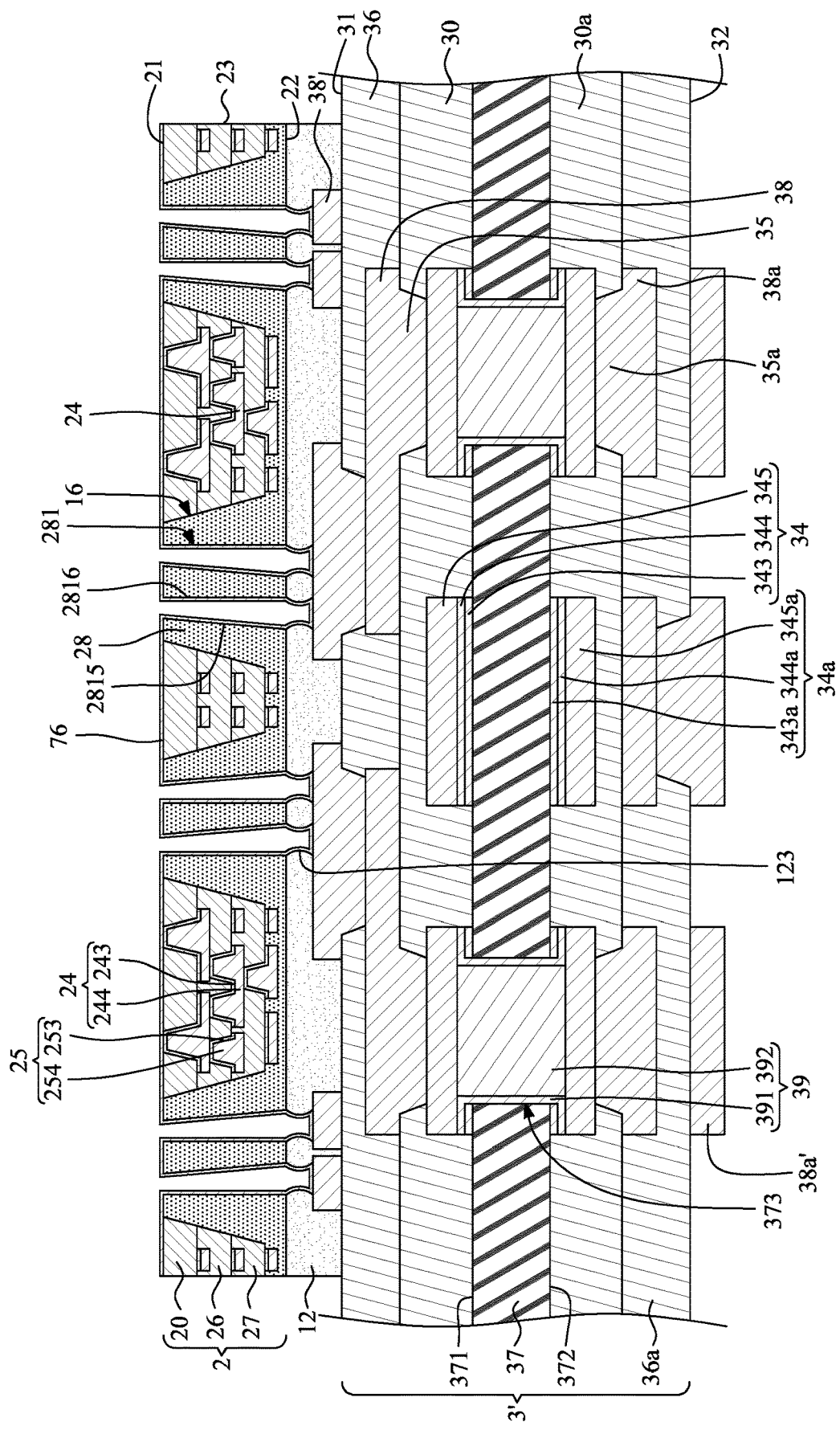
FIG. 27 illustrates one or more stages of an example of a method for manufacturing a wiring structure according to some embodiments of the present disclosure.

Referring to FIG. 27, a seed layer 76 is formed or disposed on the top surface 21 of the upper conductive structure 2, the sidewall of the through hole 281 of the insulation material 28, the sidewall of the through hole 123 of the intermediate layer 12 and the exposed portion of the topmost first circuit layer (e.g., the first upper circuit layer 38') of the lower conductive structure 3'.

Figure 28:
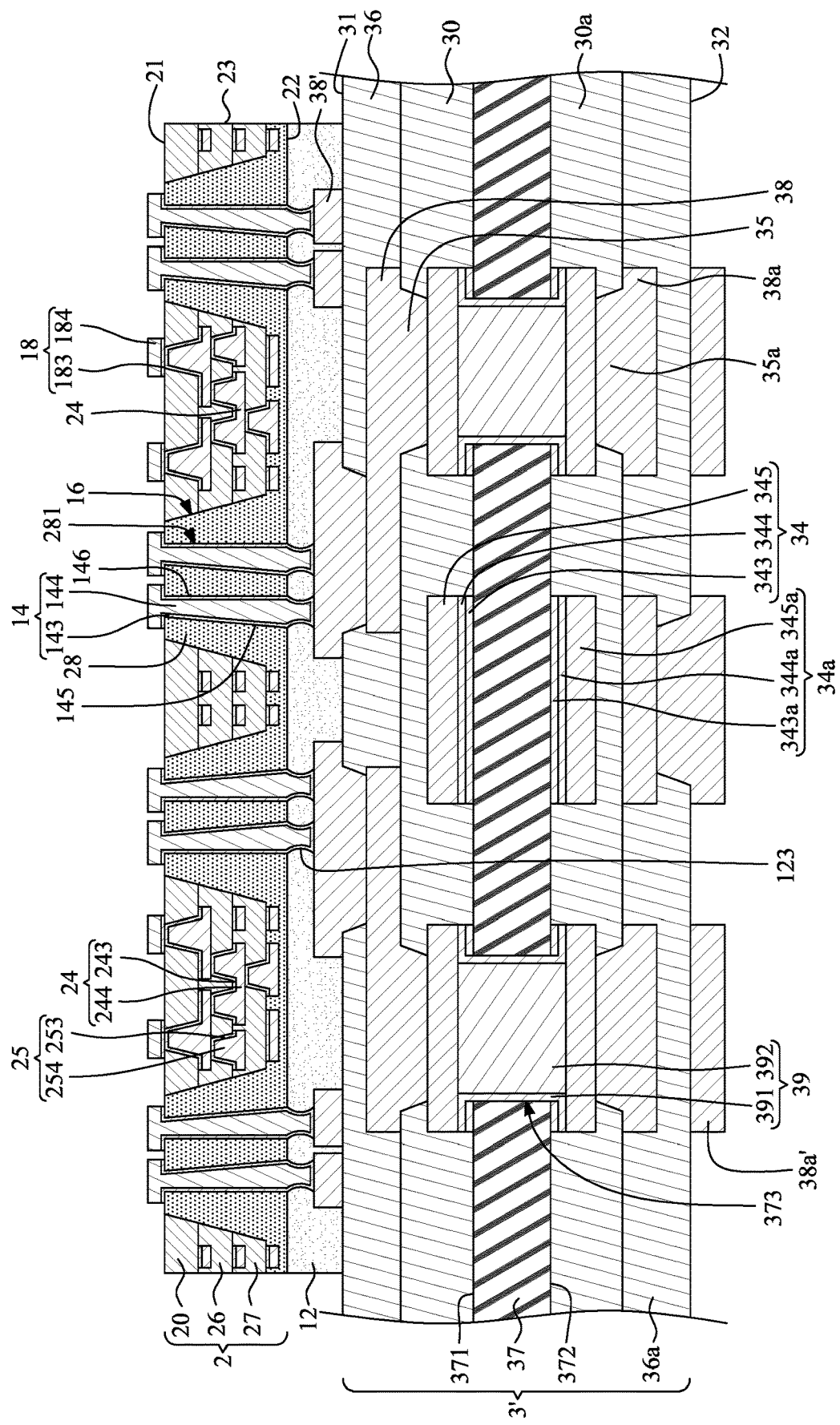
FIG. 28 illustrates one or more stages of an example of a method for manufacturing a wiring structure according to some embodiments of the present disclosure.

Referring to FIG. 28, a patterned conductive material (e.g., a metallic material) is formed or disposed on the seed layer 76 by a plating technique or other suitable techniques. In some embodiments, the patterned conductive material may include, at least one conductive material 144 and at least one conductive material 184. Then, portions of the seed layer 76 that are not covered by the patterned conductive material (including, for example, the conductive material 144 and the conductive material 184) are removed by an etching technique or other suitable techniques. Meanwhile, at least one conductive via 14 and an outer circuit layer 18 are formed. The conductive via 14 may include a seed layer 143 formed from the seed layer 76 and the conductive material 144 on the seed layer 143. The conductive material 144 may fill the through hole 281 of the insulation material 28 of the upper conductive structure 2 and the through hole 123 of the intermediate layer 12. Thus, the conductive via 14 may be formed in the through hole 281 of the insulation material 28 and the through hole 123 of the intermediate layer 12, and may extend through the insulation material 28 of the upper conductive structure 2 and the intermediate layer 12, and may contact a portion of the topmost first circuit layer (e.g., the top surface of the first upper circuit layer 38') of the lower conductive structure 3'. The outer circuit layer 18 is disposed on the top surface 21 of the upper conductive structure 2, and may include a seed layer 183 formed from the seed layer 76 and the conductive material 184.

Then, the lower conductive structure 3' is singulated so as to obtain the wiring structure 1 of FIG. 1.

Figure 29:
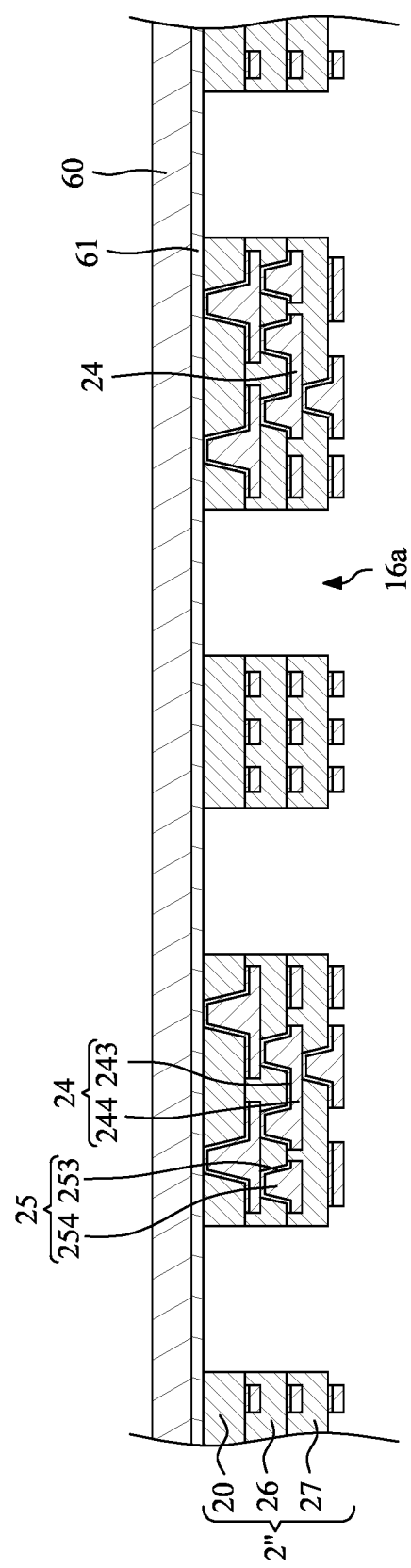
FIG. 29 illustrates one or more stages of an example of a method for manufacturing a wiring structure according to some embodiments of the present disclosure.

FIG. 29 through FIG. 32 illustrate a method for manufacturing a wiring structure according to some embodiments of the present disclosure. In some embodiments, the method is for manufacturing the wiring structure 1a shown in FIG. 4. The initial stages of the illustrated process are the same as, or similar to, the stages illustrated in FIG. 8 to FIG. 16. FIG. 29 depicts a stage subsequent to that depicted in FIG. 16.

Referring to FIG. 29, at least one accommodating hole 16a is formed to extend through the upper conductive structure 2" (including the second dielectric layers 20, 26, 27). The accommodating hole 16a may not taper. An angle between the sidewall of the accommodating hole 16a and the top surface of the upper conductive structure 2" may be substantially equal to 90 degrees.

Figure 30:
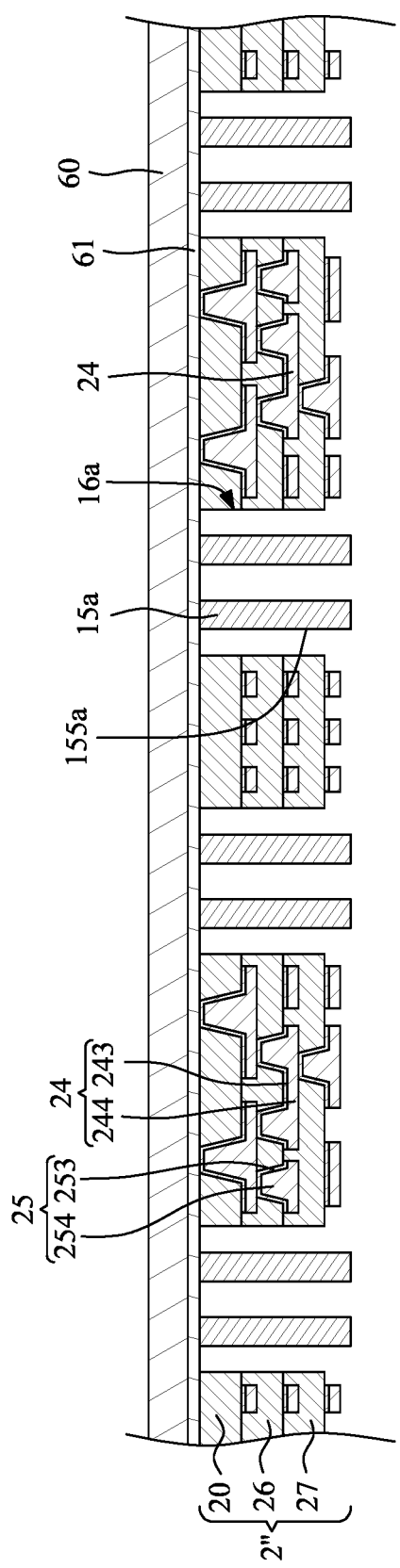
FIG. 30 illustrates one or more stages of an example of a method for manufacturing a wiring structure according to some embodiments of the present disclosure.

Referring to FIG. 30, at least one pillar 15a may be provided (e.g., formed or disposed) in the accommodating hole 16a. An angle between the peripheral side surface 155a of the pillar 15a and the top surface of the upper conductive structure 2" may be substantially equal to 90 degrees. The pillar 15a may be formed by plating with a mask patterned by a lithography process. Alternatively, the seed layer 61 may be omitted or may be replaced by a release layer, and the pillar 15a may be a monolithic preformed pillar.

Figure 31:
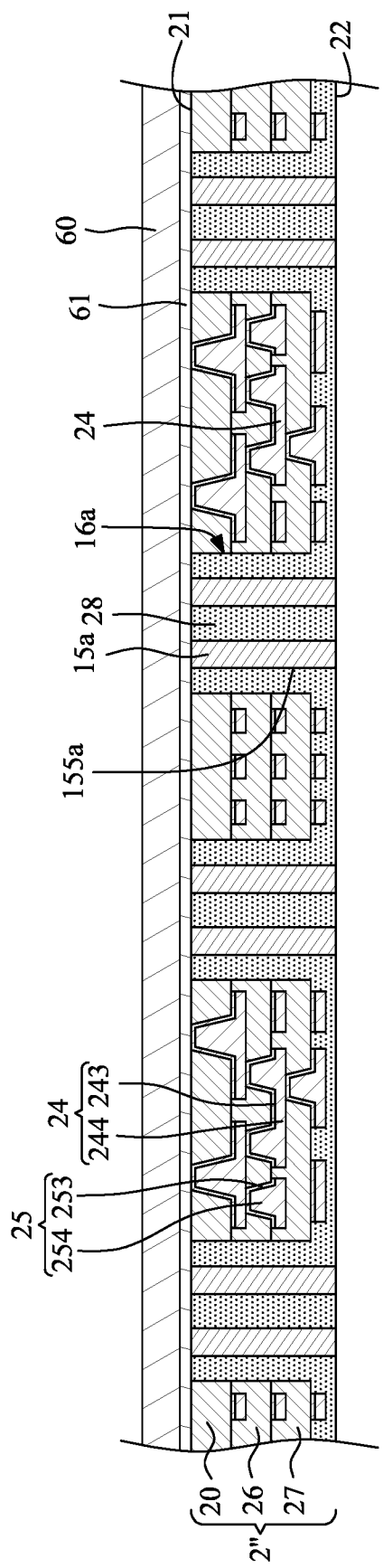
FIG. 31 illustrates one or more stages of an example of a method for manufacturing a wiring structure according to some embodiments of the present disclosure.

Referring to FIG. 31, an insulation material 28 is formed or disposed in the accommodating hole 16a to cover the pillar 15a. In some embodiments, a bottom surface of the insulation material 28 may be ground to expose the pillar 15a.

Figure 32:
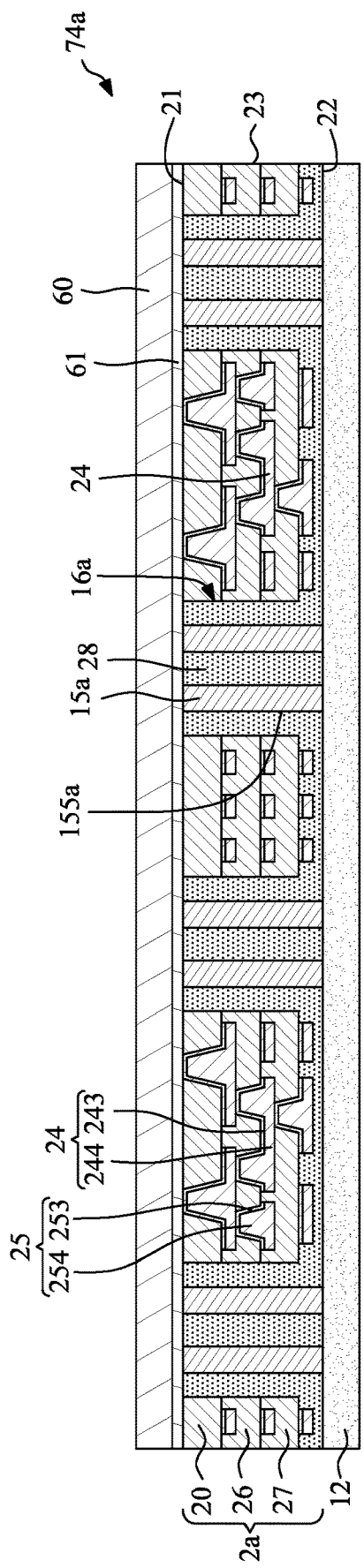
FIG. 32 illustrates one or more stages of an example of a method for manufacturing a wiring structure according to some embodiments of the present disclosure.

Referring to FIG. 32, the upper conductive structure 2" and the carrier 60 are cut to form a plurality of unit structures 74a. The unit structure 74a includes an upper conductive structure 2a and a portion of the carrier 60. The upper conductive structure 2a of FIG. 32 may be the upper conductive structure 2a of FIG. 4. Then, an adhesive layer 12 is formed or applied on the bottom surface 22 of the upper conductive structure 2a to cover and contact the insulation material 28.

Then, the following stages of the illustrated process are the same as, or similar to, the stages illustrated in FIG. 23 to FIG. 28, so as to obtain the wiring structure 1a shown in FIG. 4.

Figure 33:
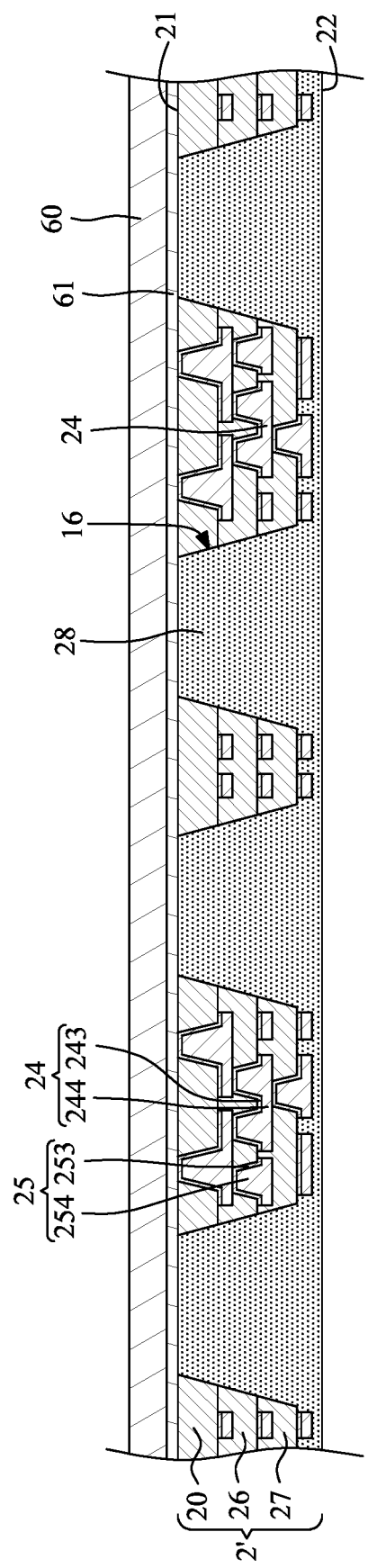
FIG. 33 illustrates one or more stages of an example of a method for manufacturing a wiring structure according to some embodiments of the present disclosure.
Figure 34:
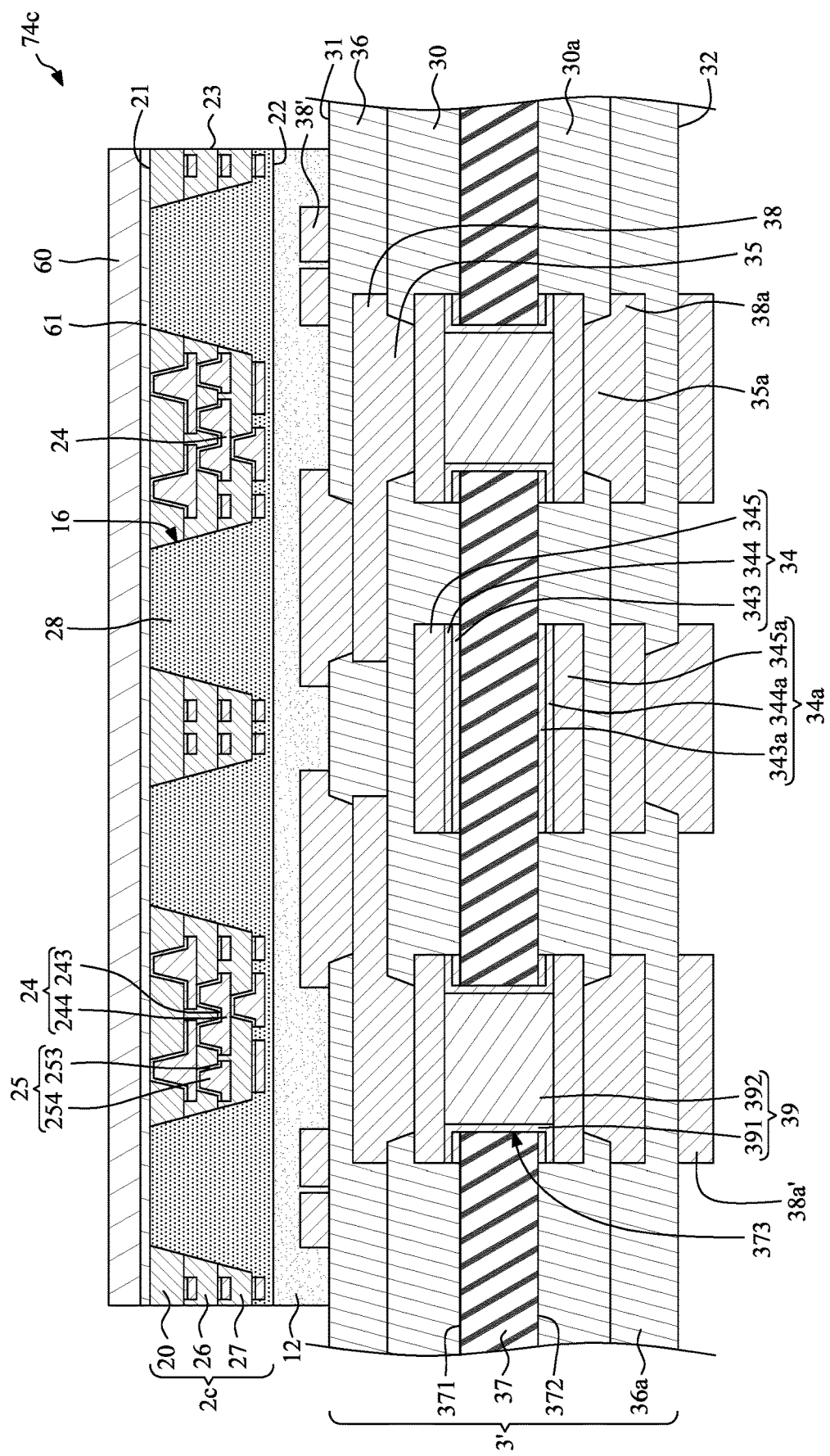
FIG. 34 illustrates one or more stages of an example of a method for manufacturing a wiring structure according to some embodiments of the present disclosure.
Figure 35:
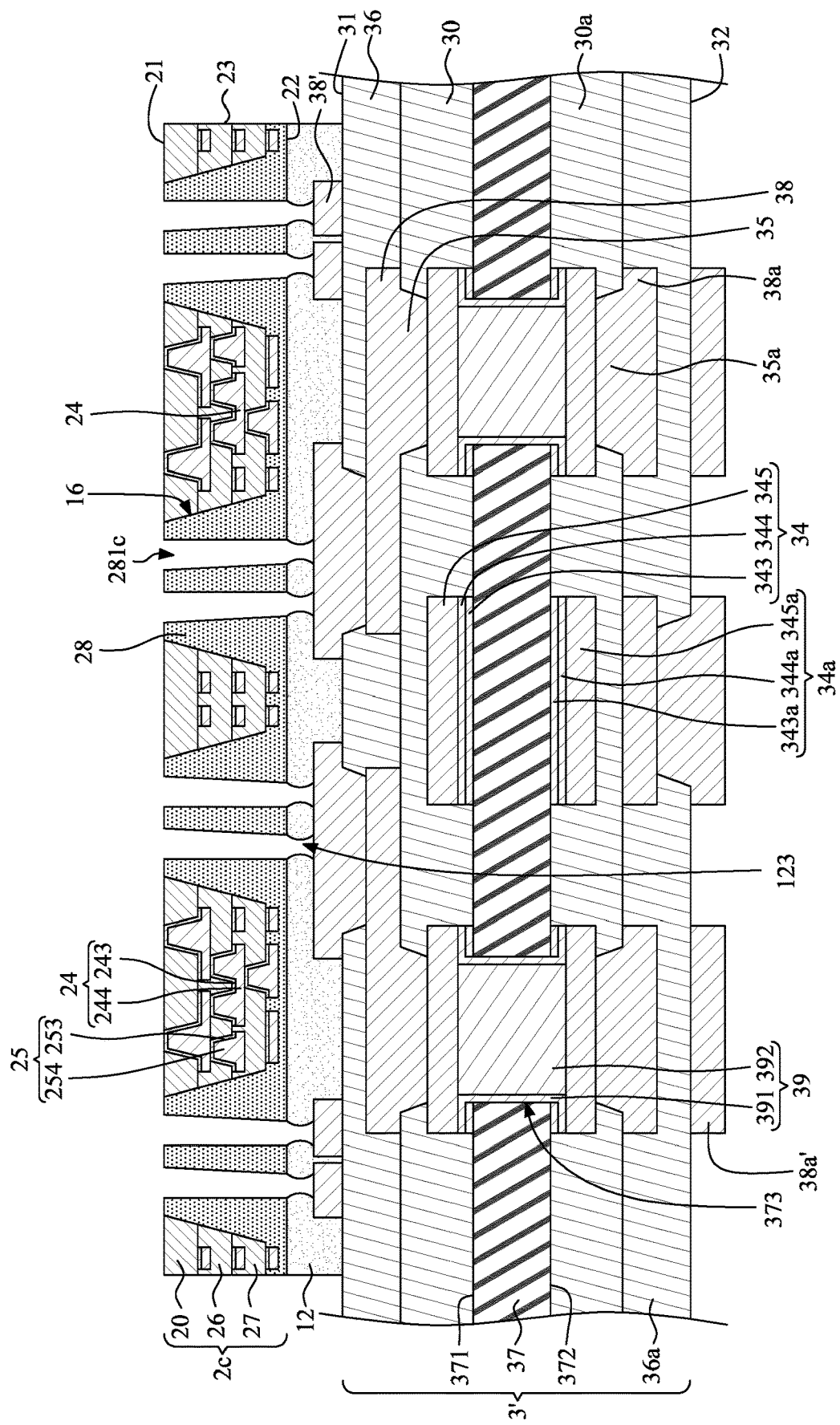
FIG. 35 illustrates one or more stages of an example of a method for manufacturing a wiring structure according to some embodiments of the present disclosure.

FIG. 33 through FIG. 35 illustrate a method for manufacturing a wiring structure according to some embodiments of the present disclosure. In some embodiments, the method is for manufacturing the wiring structure 1c shown in FIG. 6A. The initial stages of the illustrated process are the same as, or similar to, the stages illustrated in FIG. 8 to FIG. 17. FIG. 33 depicts a stage subsequent to that depicted in FIG. 17.

Referring to FIG. 33, an insulation material 28 is formed or disposed in the accommodating hole 16 to fill the accommodating hole 16. In some embodiments, the insulation material 28 may cover and contact the bottom surface of the bottommost second dielectric layer 27 and the bottommost second circuit layer 24. It is noted that the insulation material 28 may be formed from a photoresist material.

Referring to FIG. 34, the upper conductive structure 2' and the carrier 60 are cut to form a plurality of unit structures 74c. The unit structure 74c includes an upper conductive structure 2c and a portion of the carrier 60. The upper conductive structure 2c of FIG. 34 may be the upper conductive structure 2c of FIG. 6A. Then, an adhesive layer 12 is formed or applied on the bottom surface 22 of the upper conductive structure 2c to cover and contact the insulation material 28.

Referring to FIG. 35, the carrier 60 and the seed layer 61 are removed. Then, at least one through hole 281c may be formed to extend through the insulation material 28 in the accommodating hole 16 by, for example, a lithography process (e.g., exposure and development). That is, the through hole 281 of the insulation material 28 may be formed by performing a lithography process on a photoresist material (e.g., the insulation material 28). Then, a portion of the intermediate layer 12 under the through hole 281c is removed to form a through hole 123 in the intermediate layer 12.

Then, the following stages of the illustrated process are the same as, or similar to, the stages illustrated in FIG. 27 to FIG. 28, so as to obtain the wiring structure 1c shown in FIG. 6A.

Figure 36:
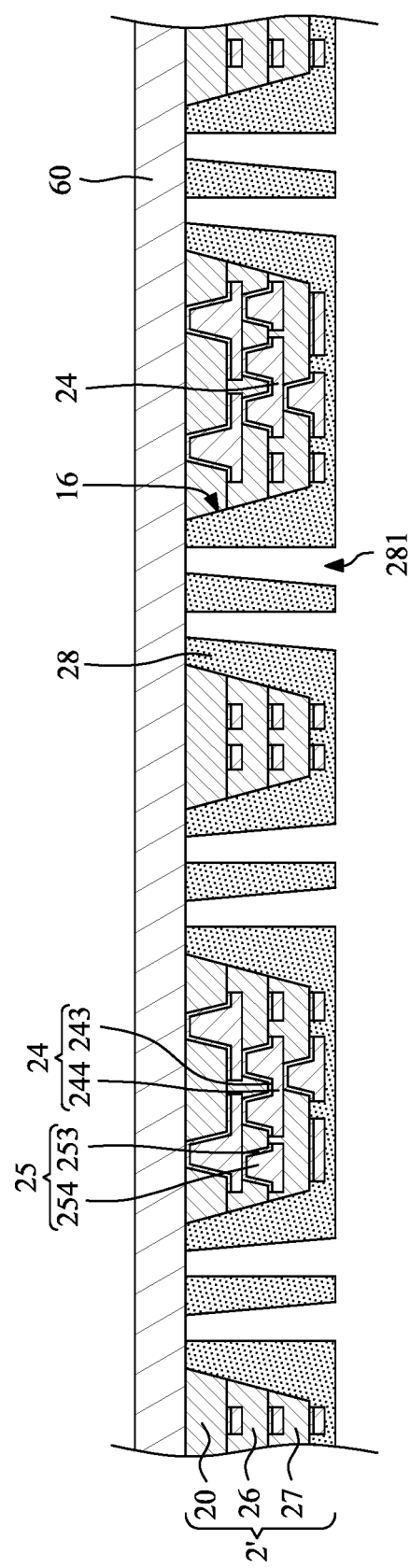
FIG. 36 illustrates one or more stages of an example of a method for manufacturing a wiring structure according to some embodiments of the present disclosure.
Figure 37:
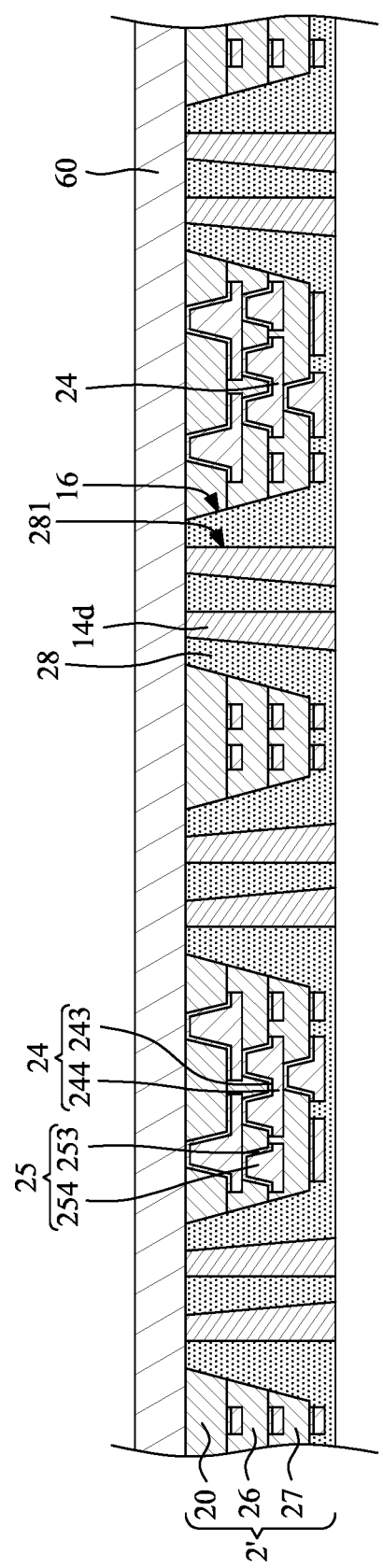
FIG. 37 illustrates one or more stages of an example of a method for manufacturing a wiring structure according to some embodiments of the present disclosure.
Figure 38:
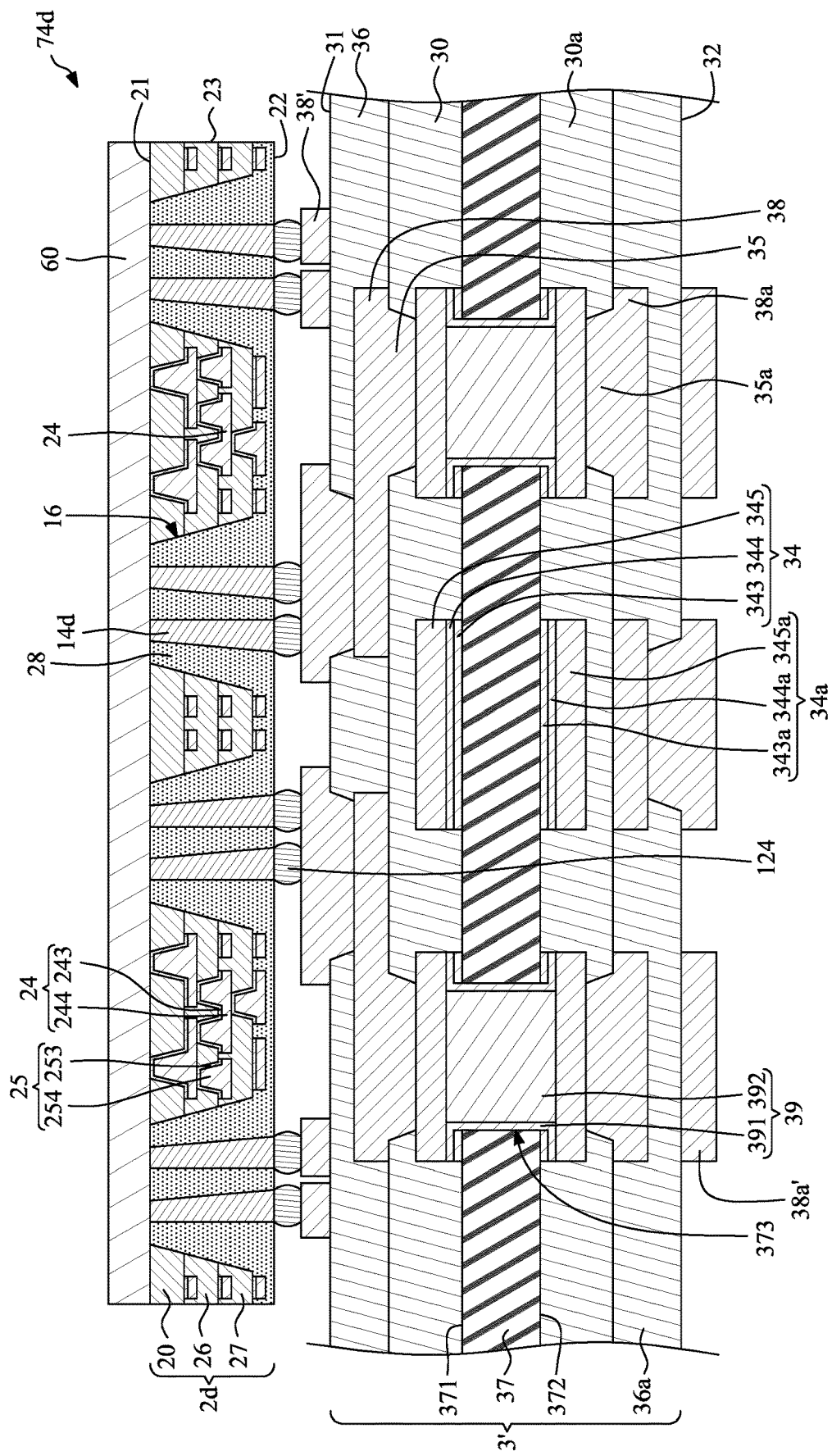
FIG. 38 illustrates one or more stages of an example of a method for manufacturing a wiring structure according to some embodiments of the present disclosure.

FIG. 36 through FIG. 38 illustrate a method for manufacturing a wiring structure according to some embodiments of the present disclosure. In some embodiments, the method is for manufacturing the wiring structure 1d shown in FIG. 6C. The initial stages of the illustrated process are the same as, or similar to, the stages illustrated in FIG. 8 to FIG. 17 and FIG. 33. FIG. 36 depicts a stage subsequent to that depicted in FIG. 33.

Referring to FIG. 36, at least one through hole 281 may be formed to extend through the insulation material 28 in the accommodating hole 16 by, for example, a lithography process (e.g., exposure and development). That is, the through hole 281 of the insulation material 28 may be formed by performing a lithography process on photoresist material (e.g., the insulation material 28). It is noted that the seed layer 61 may be omitted or may be replaced by a release layer.

Referring to FIG. 37, the conductive via 14d is provided (e.g., formed or disposed) in the through hole 281 of the insulation material 28. The conductive via 14d may be a monolithic preformed pillar. Alternatively, the conductive via 14d may be formed by plating.

Referring to FIG. 38, the upper conductive structure 2' and the carrier 60 are cut to form a plurality of unit structures 74d. The unit structure 74d includes an upper conductive structure 2d and a portion of the carrier 60. The upper conductive structure 2d of FIG. 38 may be the upper conductive structure 2d of FIG. 6C. Then, the upper conductive structure 2d is electrically connected to the lower conductive structure 3' through the solder material 24 by flip-chip bonding. Then, an intermediate layer 12 (e.g., underfill) is formed or applied between the upper conductive structure 2d and the lower conductive structure 3' to cover and protect the solder material 24.

Then, the carrier 60 is removed. Then, the lower conductive structure 3' is singulated, so as to obtain the wiring structure 1d shown in FIG. 6C.

Figure 39:
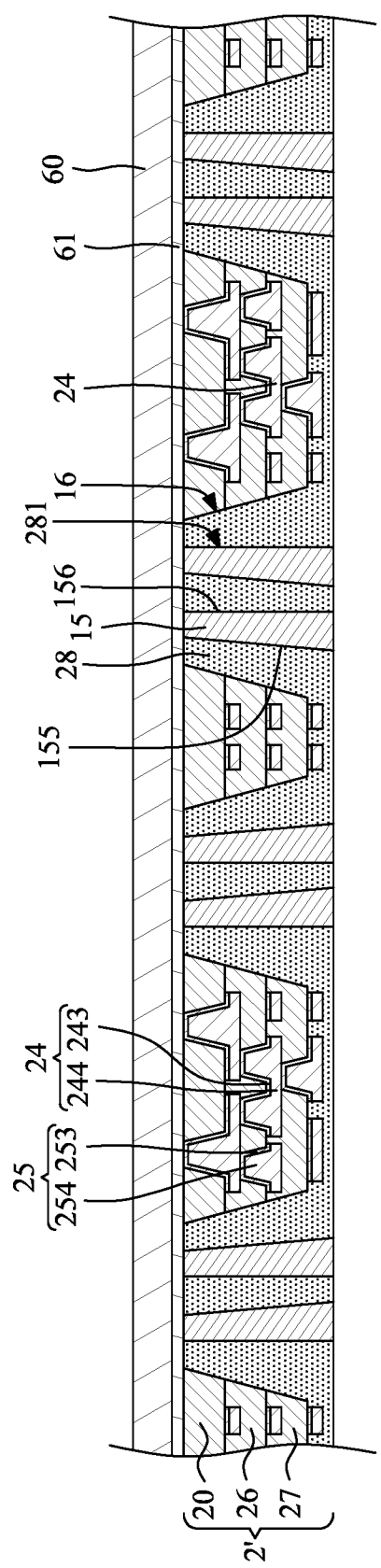
FIG. 39 illustrates one or more stages of an example of a method for manufacturing a wiring structure according to some embodiments of the present disclosure.

FIG. 39 illustrate a method for manufacturing a wiring structure according to some embodiments of the present disclosure. In some embodiments, the method is for manufacturing the wiring structure 1 shown in FIG. 1. The initial stages of the illustrated process are the same as, or similar to, the stages illustrated in FIG. 8 to FIG. 17, FIG. 33 and FIG. 36. FIG. 39 depicts a stage subsequent to that depicted in FIG. 36.

Referring to FIG. 39, at least one pillar 15 is provided (e.g., formed or disposed) in the through hole 281 of the insulation material 28. The pillar 15 may be a monolithic preformed pillar. Alternatively, the pillar 15 may be formed by plating.

Then, the following stages of the illustrated process are the same as, or similar to, the stages illustrated in FIG. 22 to FIG. 28, so as to obtain the wiring structure 1 shown in FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure comprising:
   a lower conductive structure including a first dielectric layer and a first circuit layer in contact with the first dielectric layer;
   an upper conductive structure attached to the lower conductive structure, wherein the upper conductive structure includes a plurality of second dielectric layers, a plurality of second circuit layers in contact with the second dielectric layers and defines an accommodating hole, wherein an insulation material is disposed in the accommodating hole;
   a conductive via extending through the insulation material, and electrically connecting the lower conductive structure; and
   an intermediate layer bonding the upper conductive structure and the lower conductive structure together, wherein the conductive via extends through the intermediate layer.

2. The wiring structure of claim 1, wherein the conductive via includes an upper portion in the insulation material, and a lower portion in the intermediate layer, wherein a width of the lower portion is less than a width of the upper portion.

3. The wiring structure of claim 2, wherein the lower portion of the conductive via includes a neck portion.

4. The wiring structure of claim 2, wherein a peripheral side surface of the lower portion of the conductive via is curved.

5. A wiring structure comprising:
   a lower conductive structure including a first dielectric layer and a first circuit layer in contact with the first dielectric layer;
   an upper conductive structure attached to the lower conductive structure, wherein the upper conductive structure includes a plurality of second dielectric layers, a plurality of second circuit layers in contact with the second dielectric layers and defines an accommodating hole, wherein an insulation material is disposed in the accommodating hole; and
   a conductive via extending through the insulation material, and electrically connecting the lower conductive structure, wherein a plurality of conductive vias are disposed within one accommodating hole.

6. The wiring structure of claim 5, wherein a pitch between the conductive vias is less than about 150 μm.

7. The wiring structure of claim 5, wherein a width of the conductive via in the insulation material is less than about 60 μm.

8. The wiring structure of claim 5, wherein an angle between a peripheral side surface of the conductive via and a top surface of the upper conductive structure is in a range from 80 degrees to 100 degrees.

9. The wiring structure of claim 5, further comprising at least one electronic device deposed on the upper conductive structure.

10. A wiring structure comprising:
    a low-density conductive structure;
    a high-density conductive structure disposed over the low-density conductive structure, wherein the high-density conductive structure includes a plurality of second dielectric layers, and defines an accommodating hole extending through the plurality of second dielectric layers, wherein an insulation material is disposed in the accommodating hole, wherein the insulation material extends from a sidewall of the accommodating hole of the high-density conductive structure to below the high-density conductive structure;
    a conductive via extending through the insulation material, and electrically connecting the low-density conductive structure; and
    an intermediate layer configured to bond the high-density conductive structure and the low-density conductive structure, wherein a portion of the insulation material is disposed between the high-density conductive structure and the intermediate layer.

11. The wiring structure of claim 10, wherein a bottom surface of the insulation material contacts a top surface of the intermediate layer.

12. The wiring structure of claim 10, wherein a top surface of the insulation material is exposed from a top surface of the high-density conductive structure.

13. A wiring structure comprising:
    a low-density conductive structure;
    a high-density conductive structure disposed over the low-density conductive structure, wherein the high-density conductive structure includes a plurality of second dielectric layers, and defines an accommodating hole extending through the plurality of second dielectric layers, wherein an insulation material is disposed in the accommodating hole, wherein the insulation material extends from a sidewall of the accommodating hole of the high-density conductive structure to below the high-density conductive structure, wherein a top surface of the insulation material is exposed from a top surface of the high-density conductive structure; and
    a conductive via extending through the insulation material, and electrically connecting the low-density conductive structure; wherein in a cross-sectional view, the insulation material tapers toward a top surface of the insulation material.

14. The wiring structure of claim 13, wherein the conductive via includes a seed layer and a conductive material, and the seed layer is interposed between the conductive material and the insulation material.

15. The wiring structure of claim 14, wherein the seed layer is spaced apart from the plurality of second dielectric layers of the high-density conductive structure.

16. A wiring structure comprising:
- a low-density conductive structure;
- a high-density conductive structure disposed over the low-density conductive structure, wherein the high-density conductive structure includes a plurality of second dielectric layers, and defines an accommodating hole extending through the plurality of second dielectric layers, wherein an insulation material is disposed in the accommodating hole; and
- a conductive via extending through the insulation material, and electrically connecting the low-density conductive structure; wherein the insulation material covers a bottommost one of the plurality of second dielectric layers.

17. A wiring structure comprising:
- a low-density conductive structure;
- a high-density conductive structure disposed over the low-density conductive structure, wherein the high-density conductive structure includes a plurality of second dielectric layers, and defines an accommodating hole extending through the plurality of second dielectric layers, wherein an insulation material is disposed in the accommodating hole; and
- a conductive via extending through the insulation material, and electrically connecting the low-density conductive structure; wherein a boundary between the insulation material and the plurality of second dielectric layers is substantially perpendicular to a bottom surface or a top surface of the high-density conductive structure.

* * * * *